(12) United States Patent
Jeong et al.

(10) Patent No.: US 10,969,889 B2
(45) Date of Patent: Apr. 6, 2021

(54) ELECTRONIC APPARATUS AND METHOD FOR MANUFACTURING THE SAME

(71) Applicant: Samsung Display Co., Ltd., Yongin-Si (KR)

(72) Inventors: Yu-gwang Jeong, Anyang-si (KR); Sanggab Kim, Seoul (KR); Subin Bae, Hwaseong-si (KR); Sungwon Cho, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/559,540

(22) Filed: Sep. 3, 2019

(65) Prior Publication Data

US 2020/0073500 A1 Mar. 5, 2020

(30) Foreign Application Priority Data

Sep. 3, 2018 (KR) .................... 10-2018-0104569

(51) Int. Cl.
*G06F 3/041* (2006.01)
*H01L 27/32* (2006.01)
(Continued)

(52) U.S. Cl.
CPC .......... *G06F 3/0412* (2013.01); *G06F 3/0445* (2019.05); *H01L 27/323* (2013.01); (Continued)

(58) Field of Classification Search
CPC . G06F 3/0412; G06F 3/0445; H01L 27/3244; H01L 27/323; H01L 51/5253;
(Continued)

(56) References Cited

U.S. PATENT DOCUMENTS

| 9,905,629 B2 | 2/2018 | Kim et al. |
| 2016/0190389 A1* | 6/2016 | Lee ..................... H01L 51/0097 |
| | | 257/93 |

(Continued)

FOREIGN PATENT DOCUMENTS

| KR | 10-2017-0110217 A | 10/2017 |
| KR | 10-2017-0115177 A | 10/2017 |

(Continued)

*Primary Examiner* — Ibrahim A Khan
(74) *Attorney, Agent, or Firm* — Innovation Counsel LLP

(57) ABSTRACT

Provided is an electronic apparatus. The electronic apparatus includes a base substrate which includes a front surface and a rear surface facing each other, and in which a module hole passing through the front and rear surfaces is defined, a thin film transistor disposed on the base substrate, a light emitting device including a first electrode connected to the thin film transistor, a second electrode disposed on the first electrode, and a light emitting pattern disposed between the first electrode and the second electrode, an encapsulation layer which covers the light emitting device, an input sensing unit disposed on the base substrate and including a plurality of first conductive patterns and second conductive patterns disposed on the first conductive patterns, and an insulation layer disposed between the first conductive patterns and the second conductive patterns. The encapsulation layer is disposed between the first conductive patterns and the second conductive patterns.

20 Claims, 29 Drawing Sheets

(51) Int. Cl.
*H01L 51/52* (2006.01)
*H01L 51/56* (2006.01)
*G06F 3/044* (2006.01)
*H01L 51/00* (2006.01)

(52) U.S. Cl.
CPC ...... *H01L 27/3244* (2013.01); *H01L 51/0096* (2013.01); *H01L 51/5253* (2013.01); *H01L 51/56* (2013.01); *H01L 2227/323* (2013.01)

(58) Field of Classification Search
CPC ................. H01L 51/56; H01L 51/0096; H01L 2227/323; H01L 51/52; H01L 27/3276; Y02E 10/549
See application file for complete search history.

(56) References Cited

U.S. PATENT DOCUMENTS

| | | | | |
|---|---|---|---|---|
| 2016/0197301 | A1* | 7/2016 | Wakahara | H01L 51/52 257/40 |
| 2016/0266706 | A1* | 9/2016 | Lu | G06F 3/04164 |
| 2017/0148856 | A1* | 5/2017 | Choi | H01L 27/3258 |
| 2017/0150618 | A1* | 5/2017 | Choi | H02J 50/10 |
| 2017/0162637 | A1* | 6/2017 | Choi | G09G 3/3225 |
| 2017/0278867 | A1 | 9/2017 | Jeong et al. | |
| 2017/0364763 | A1* | 12/2017 | Jin | G06F 21/32 |
| 2018/0033829 | A1* | 2/2018 | Oh | G06F 3/03547 |
| 2018/0059855 | A1* | 3/2018 | Gwon | G06F 3/04164 |
| 2018/0069063 | A1 | 3/2018 | Kim et al. | |
| 2018/0143717 | A1* | 5/2018 | An | G06F 3/0416 |
| 2018/0164933 | A1* | 6/2018 | Jun | G09G 3/3258 |
| 2018/0166521 | A1 | 6/2018 | Bae et al. | |
| 2018/0175116 | A1* | 6/2018 | Song | G06F 3/0412 |
| 2018/0348584 | A1* | 12/2018 | Wu | G06F 3/0443 |
| 2018/0373080 | A1* | 12/2018 | Zou | G06F 3/04184 |
| 2019/0267434 | A1* | 8/2019 | Liu | G06F 1/1637 |
| 2019/0280067 | A1 | 9/2019 | Jeong et al. | |
| 2019/0326361 | A1* | 10/2019 | Gwon | G06F 3/04164 |
| 2020/0059545 | A1* | 2/2020 | Lee | H01L 51/56 |
| 2020/0073500 | A1* | 3/2020 | Jeong | H01L 27/3244 |

FOREIGN PATENT DOCUMENTS

| | | |
|---|---|---|
| KR | 10-2018-0026599 A | 3/2018 |
| KR | 10-2018-0069175 A | 6/2018 |
| KR | 10-2019-0107233 A | 9/2019 |
| KR | 10-2020-0003334 A | 1/2020 |

* cited by examiner

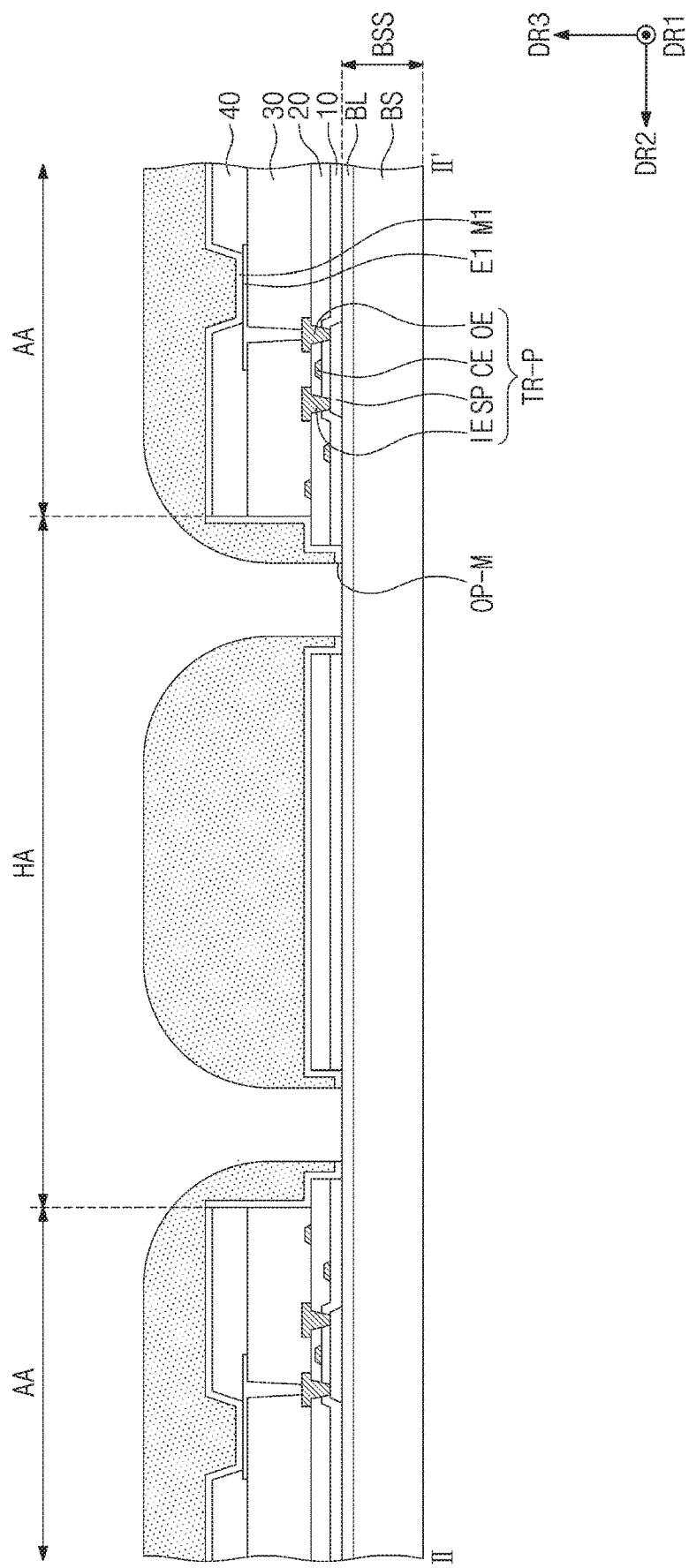

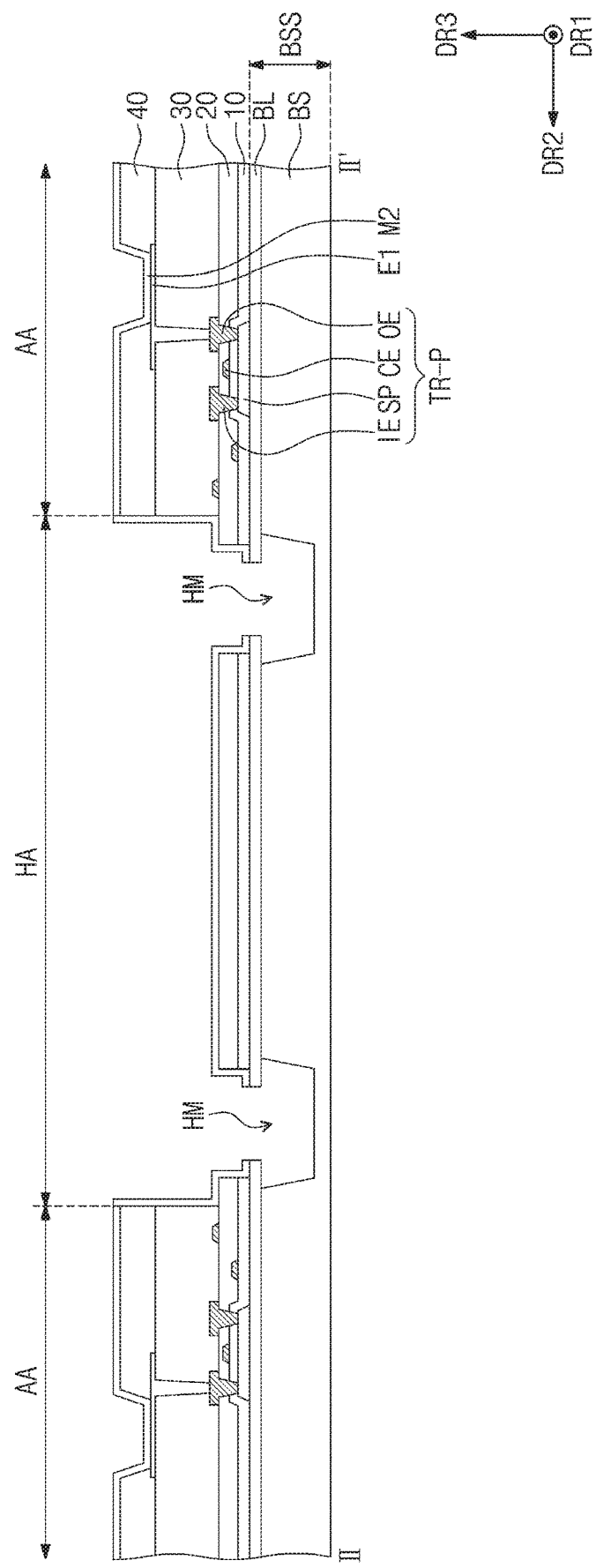

ELECTRONIC APPARATUS AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2018-0104569, filed on Sep. 3, 2018, the entire contents of which are hereby incorporated by reference.

BACKGROUND

The present disclosure herein relates to an electronic apparatus and a method for manufacturing the same, and more particularly, to an electronic apparatus with a simplified manufacturing process and a method for manufacturing the same.

Electronic apparatuses are activated according to an electrical signal. Such an electronic apparatus may include devices constituted by various electronic components such as a display unit displaying an image and an input sensing unit sensing an external input. The electronic components may be electrically connected to each other by signal lines, which are variously arranged.

The display unit includes a light emitting element that generates an image. The input sensing unit may include sensing electrodes for sensing an external input. The electronic apparatus in which the display unit and the input sensing unit are provided in one panel may increase in thickness and thus increase in process cost.

SUMMARY

The present disclosure provides an electronic apparatus, in which integration of a display unit and an input sensing unit is improved, and a manufacturing process is simplified, and a method for manufacturing the same.

An embodiment of the inventive concept provides an electronic apparatus including: a base substrate which includes a front surface and a rear surface facing each other, and in which a module hole passing through the front and rear surfaces is defined; a thin film transistor disposed on the base substrate; a light emitting device including a first electrode connected to the thin film transistor, a second electrode disposed on the first electrode, and a light emitting pattern disposed between the first electrode and the second electrode; an encapsulation layer configured to cover the light emitting device; an input sensing unit disposed on the base substrate and including a plurality of first conductive patterns and second conductive patterns disposed on the first conductive patterns; and an insulation layer disposed between the first conductive patterns and the second conductive patterns, wherein the encapsulation layer is disposed between the first conductive patterns and the second conductive patterns.

In an embodiment, the second conductive patterns may include: a first sensing electrode extending in a first direction; and a second sensing electrode extending in a direction crossing the first direction to generate capacitance together with the first sensing electrode.

In an embodiment, at least a portion of the first conductive patterns may be connected to at least a portion of the second conductive patterns through a contact hole passing through the encapsulation layer.

In an embodiment, the first conductive patterns may overlap the second electrode on a plane, and the contact hole may pass through the second electrode.

In an embodiment, the electronic apparatus may further include an inner insulation layer configured to cover a side surface of the contact hole, wherein the second electrode and the second conductive patterns may be electrically connected to each other by the inner insulation layer.

In an embodiment, each of the first electrode, the light emitting pattern, and the second electrode may be provided in plurality, and the second electrodes may be disposed to overlap the light emitting patterns, respectively.

In an embodiment, the first conductive patterns may be spaced apart from the second electrodes on the plane.

In an embodiment, the electronic apparatus may further include an auxiliary electrode adjacent to the first electrodes, wherein the second electrodes may be connected to the auxiliary electrode.

In an embodiment, the first conductive patterns and the second conductive patterns may be spaced apart from each other on the plane.

In an embodiment, the insulation layer may include an organic layer disposed between the first electrode and the second electrode, and the organic layer may entirely cover the first conductive patterns.

In an embodiment, the insulation layer may further include a plurality of insulation patterns that respectively cover the first conductive patterns, and the organic layer may cover the insulation patterns.

In an embodiment, the insulation patterns may cover top and side surfaces of each of the first conductive patterns, respectively.

In an embodiment, the encapsulation layer may include a first inorganic layer, a second inorganic layer disposed on the first inorganic layer, and an organic layer disposed between the first inorganic layer and the second inorganic layer, and the module hole may pass through the first inorganic layer and the second inorganic layer.

In an embodiment, the electronic apparatus may further include a groove part defined along an edge of the module hole and recessed from the front surface of the base substrate, wherein the first inorganic layer and the second inorganic layer may cover a side surface of the groove part.

In an embodiment, the electronic apparatus may further include an organic pattern disposed in the groove part, wherein the organic pattern may be covered by the first inorganic layer and the second inorganic layer.

In an embodiment, the organic pattern may include a same material as at least one of the insulation layer and the second electrode.

In an embodiment of the inventive concept, a method for manufacturing an electronic apparatus includes: forming a thin film transistor on a base substrate including a hole area and an active area adjacent to the hole area; forming a first electrode connected to the thin film transistor on the active area; forming an insulation layer in which an opening exposing at least a portion of the first electrode is defined; forming a first mask layer including an opening exposing at least a portion of the hole area of the base substrate; forming a recess part in the base substrate through the opening of the first mask layer; patterning the first mask layer to form a plurality of first conductive patterns, which are spaced apart from the opening; forming a light emitting pattern in the opening; forming an organic layer overlapping the light emitting pattern and the first conductive pattern on a plane; forming a second electrode on the organic layer; forming an encapsulation layer on the second electrode; and forming a plurality of second conductive patterns on the encapsulation layer.

In an embodiment, the method may further include: forming a plurality of contact holes passing through the encapsulation layer and the second electrode; and forming an inner insulation layer covering inner surfaces of the contact holes and exposing top surfaces of at least a portion of the first conductive patterns, wherein at least a portion of the second conductive patterns may contact top surfaces of the first conductive patterns exposed through the contact holes.

In an embodiment, the light emitting pattern may be provided in plurality, and the forming of the second electrode may further include forming a plurality of patterns respectively overlapping the light emitting patterns.

In an embodiment, the base substrate may include a base layer and an auxiliary layer covering a front surface of the base layer, and the recess part may pass through the auxiliary layer and is recessed from the front surface of the base layer.

BRIEF DESCRIPTION

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 8A, 8B, 8C, 8D, 8E, 8F, 8G, 8H, 8I, 8J, 8K, 8L and 8M are cross-sectional views illustrating a process of manufacturing an electronic panel according to an embodiment of the inventive concept.

DETAILED DESCRIPTION

Figure 1:
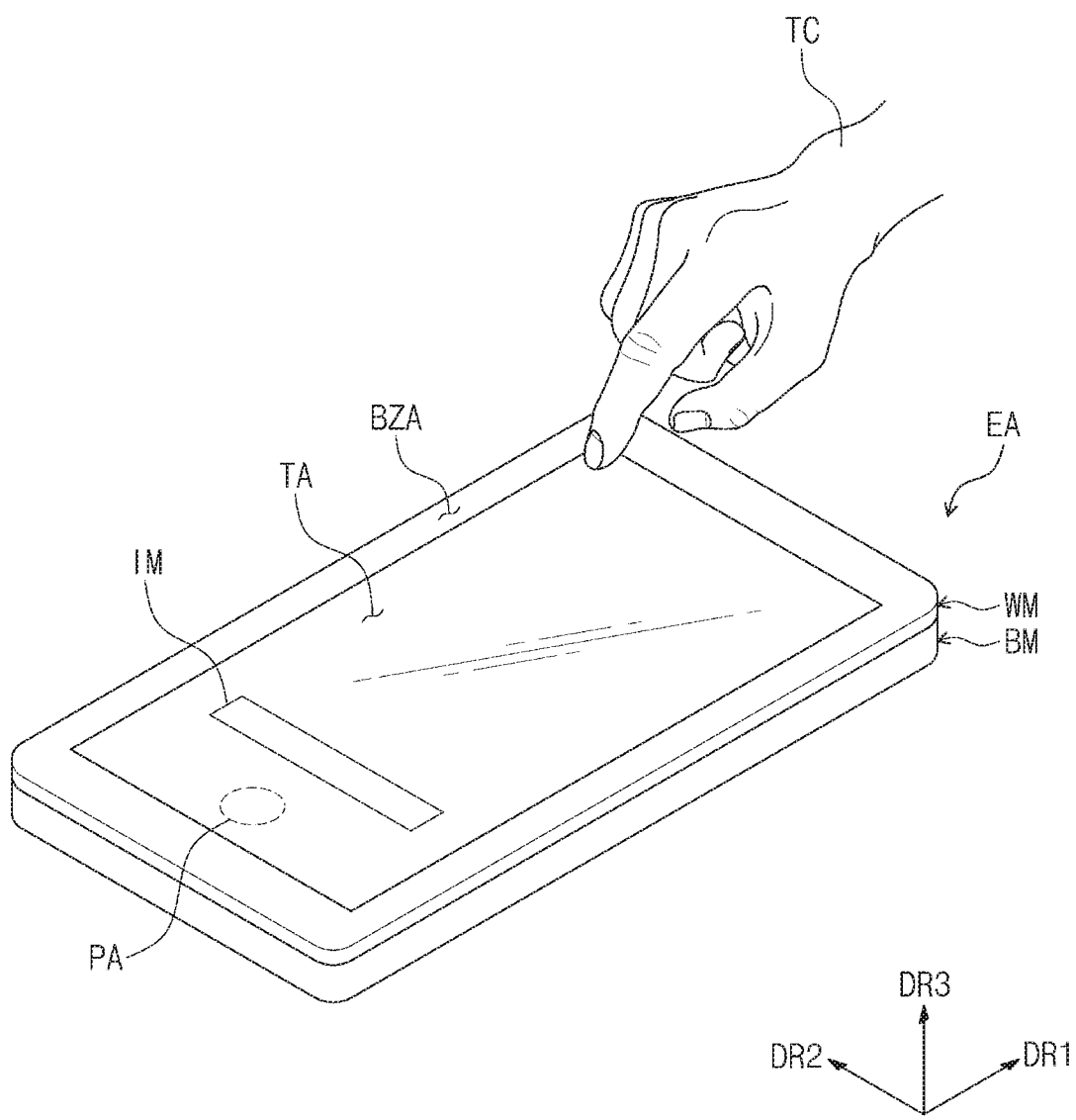
FIG. 1 is a perspective view of an electronic apparatus according to an embodiment of the inventive concept.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, exemplary embodiments of the inventive concept will be described with reference to the accompanying drawings.

Figure 2A:
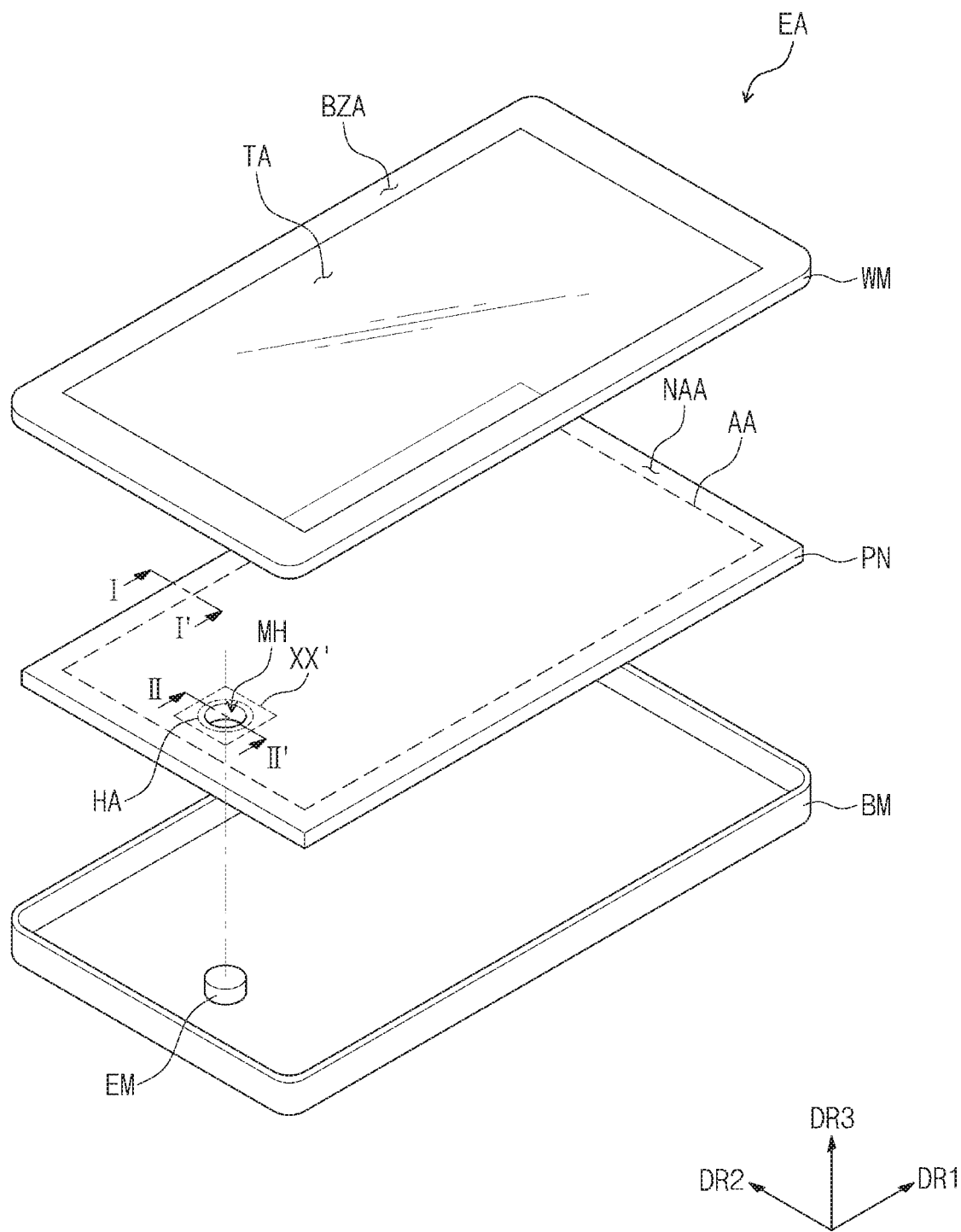
FIG. 2A is an exploded perspective view of the electronic apparatus of FIG. 1.
Figure 2B:
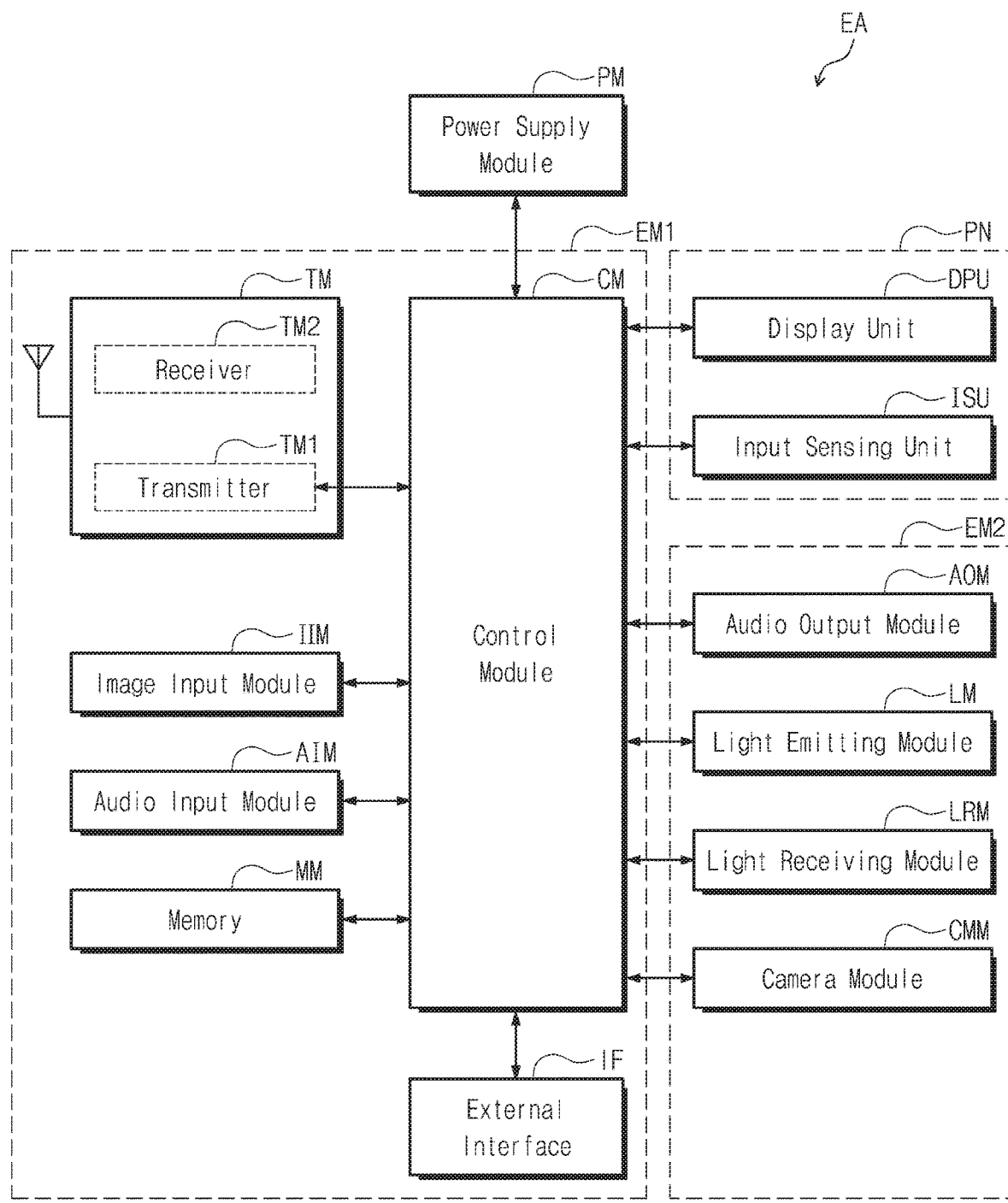
FIG. 2B is a block diagram of the electronic apparatus of FIG. 1.

FIG. 1 is a perspective view of an electronic apparatus according to an embodiment of the inventive concept. FIG. 2A is an exploded perspective view of the electronic apparatus of FIG. 1. FIG. 2B is a block diagram of the electronic apparatus of FIG. 1. Hereinafter, an electronic apparatus according to an embodiment of the inventive concept will be described with reference to FIGS. 1 to 2B.

An electronic apparatus EA may be an apparatus that is activated according to an electrical signal. The electronic apparatus EA may include various examples. For example, the electronic apparatus EA may include a tablet, a notebook, a computer, a smart television, and the like. In this embodiment, the electronic apparatus EA including a smart phone will be described as an example.

As illustrated in FIG. 1, the electronic apparatus EA may display an image IM on a front surface thereof. The front surface may be defined in parallel to a surface defined by a first direction DR1 and a second direction DR2. The front surface may include a transmission area TA and a bezel area BZA adjacent to the transmission area TA.

The image IM is displayed on the transmission area TA of the electronic apparatus EA. FIG. 1A illustrates an Internet search window as an example of the image IM. The transmission area TA may have a rectangular shape that is parallel to the first direction DR1 and the second direction DR2. However, this is merely an example. For example, the electronic apparatus EA may have various shapes and is not limited to the illustrated shape.

The bezel area BZA is adjacent to the transmission area TA. The bezel area BZA may surround the transmission area TA. However, this is merely an example. For example, the bezel area BZA may be disposed adjacent to only one side of the transmission area TA, or may be omitted. The electronic apparatus according to the inventive concept may include various configurations, and is not limited to the illustrated configuration.

A normal direction of the front surface may correspond to a thickness direction (hereinafter, referred to as a third direction) of the electronic apparatus EA. In this embodiment, a front surface (or a top surface) or a rear surface (or a bottom surface) of each of the members may be defined with respect to a direction in which the image IM is displayed. The front and rear surfaces may face each other in the third direction DR3.

The directions indicated as the first to third direction DR1, DR2, and DR3 may be relative concepts and thus, alternatively, may be changed into different directions. Hereinafter, the first to third directions may be directions indicated by the first to third direction DR1, DR2, and DR3 and designated by the same reference numerals, respectively.

The electronic apparatus EA according to the inventive concept may sense a user's input TC applied from the outside. The user's input TC includes various types of external inputs such as a portion of user's body, light, heat, a pressure, or the like. In this embodiment, the user's input TC is illustrated as a user's hand applied to the front surface. However, this is merely an example. For example, as described above, the user's input TC may be provided in various shapes. The electronic apparatus EA may sense the user's input TC applied to a side surface or the rear surface of the electronic apparatus EA according to a structure of the electronic apparatus EA, but is not limited to a specific embodiment.

As illustrated in FIGS. 1 and 2A, the electronic apparatus EA includes an electronic panel PN, a window member WM, an electronic module EM, and an accommodation member BM. As illustrated in FIG. 2B, the electronic apparatus EA may further include a first electronic module EM1, a second electronic module EM2, and a power supply module PM in addition to the electronic panel PN. In FIG. 2A, portions of the constituents of the FIG. 2B are omitted. Hereinafter, the electronic apparatus EA will be described with reference to FIGS. 1 to 2B.

The electronic panel PN may display the image IM and sense the external input TC. For example, the electronic panel PN may include a display unit DPU displaying the image IM and an input sensing unit ISU sensing the external input TC. In this embodiment, the input sensing unit ISU may sense an input applied to the window member WM.

The electronic panel PN may include an active area AA, a peripheral area NAA, and a hole area HA, which are divided on a plane. The active area AA may be an area that is activated according to an electrical signal.

In this embodiment, the active area AA may be an area on which the image is displayed, and also, the external input TC is sensed. However, this is merely an example. For example, an area of the active area AA, on which the image IM is displayed, and an area of the active area AA, on which the external input TC is sensed, may be separated from each other, and the present disclosure is not limited to a specific embodiment.

The peripheral area NAA may be an area covered by the bezel area BZA. The peripheral area NAA is adjacent to the active area AA. The peripheral area NAA may surround the active area AA. A driving circuit or a driving line for driving the active area AA may be disposed on the peripheral area NAA.

In this embodiment, the electronic panel PN may be assembled in a state in which the active area AA and the peripheral area NAA are flat to face the window member WM. However, this is merely an example. For example, a portion of the peripheral area NAA of the electronic panel PN may be bent. Here, a portion of the peripheral area NAA may be disposed to face a rear surface of the electronic apparatus EA to reduce an area of the bezel BZA on the front surface of the electronic apparatus EA. Alternatively, the electronic panel may be assembled in a state in which a portion of the active area AA is bent. Alternatively, in the electronic panel PN according to an embodiment of the inventive concept, the peripheral area NAA may be omitted.

An edge of the hole area HA may be surrounded by the active area AA. The hole area HA may be spaced apart from the peripheral area NAA with the active area AA therebetween on the plane.

The hole area HA may be an area in which a module hole MH is defined. Thus, the module hole MH may be surrounded by the active area AA, on which the image IM is displayed, on the plane.

At least one module hole MH passing through the electronic panel PN in the third direction DR3 may be defined in the electronic panel PN according to an embodiment of the inventive concept. The module hole MH may be a through-hole connected from the front surface to the rear surface of the electronic panel PN. A constituent disposed on the rear surface of the electronic panel PN to overlap the module hole MH may be visible through the module hole MH at the front surface of the electronic panel PN. In this embodiment, although the module hole MH has a cylindrical shape having a height in the third direction DR3, the present inventive concept is not limited thereto. For example, the module hole MH may have a polygonal column shape, an oval column shape, a cone shape, and the like, and is not limited to a specific embodiment.

The module hole MH overlaps the electronic module EM on the plane. The electronic module EM may receive a signal inputted through the module hole MH to provide the signal to the electronic panel PN. The electronic module EM may receive an external input through the module hole MH. The electronic module EM may be a module having a size that can be accommodated in the module hole MH and/or have a size that is similar to that of the module hole MH. The electronic module EM will be described below in more detail.

The window member WM is disposed on the front surface of the electronic apparatus EA. The window member WM may be disposed on the front surface of the electronic panel PN to protect the electronic panel PN. For example, the window member WM may include a glass substrate, a sapphire substrate, or a plastic film. The window member WM may have a single layer or multilayered structure. For example, the window member WM may have a laminated structure of a plurality of plastic films bonded to each other by using an adhesive or a laminated structure of a glass substrate and a plastic film, which are bonded to each other by using an adhesive.

The window member WM may be divided into the transmission area TA and the bezel area BZA. The transmission area TA may be an area through which incident light is transmitted. The transmission area TA may have a shape corresponding to that of the active area AA. For example, the transmission area TA overlaps an entire surface of at least a portion of the active area AA. The image IM displayed on the active area AA of the electronic panel PN may be visible through the transmission area TA from the outside.

The bezel area BZA may be an area having light transmittance that is relatively less than that of the transmission area TA. The bezel area BZA defines a shape of the transmission area TA. The bezel area BZA may be disposed adjacent to the transmission area TA to surround the transmission area TA.

The bezel area BZA may have a predetermined color. The bezel area BZA may cover the peripheral area NAA of the electronic panel PN to prevent the peripheral area NAA from being visible from the outside. However, this is merely an example. For example, in the window member WM according to an embodiment of the inventive concept, the bezel area BZA may be omitted.

The accommodation member BM may be coupled to the window member WM. The accommodation member BM may be provided on the rear surface of the electronic apparatus EA. The accommodation member BM be coupled to the window member WM to define an inner space.

The accommodation member BM may include a material having relatively high rigidity. For example, the accommodation member BM may include a plurality of frames and/or plates, which are made of glass, plastic, and metal. The accommodation member BM may stably protect the constituents of the electronic apparatus, which are accommodated in the inner space, against an external impact. The electronic panel PN and the various constituents of FIG. 2B may be accommodated in the inner space provided by the accommodation member BM.

Referring to FIG. 2B, the electronic apparatus EA may include a power supply module PM, a first electronic module EM1, and a second electronic module EM2. The power supply module PM supplies power required for an overall operation of the electronic apparatus EA. The power supply module PM may include a general battery module.

The first electronic module EM1 and the second electronic module EM2 may include various functional modules for driving the electronic apparatus EA. The first electronic module EM1 may be directly mounted on a mother board electrically connected to the electronic panel PN or may be mounted on a separate board and electrically connected to the mother board through a connector (not shown).

The first electronic module EM1 may include a control module CM, a wireless communication module TM, an image input module IIM, an audio input module AIM, a memory MM, and an external interface IF. A portion of the modules may not be mounted on the mother board but electrically connected to the mother board through a flexible circuit board.

The control module CM controls the overall operation of the electronic apparatus EA. The control module CM may be a microprocessor. For example, the control module CM may activate or inactivate the electronic panel PN. The control module CM may control other modules such as the image input module IIM or the audio input module AIM on the basis of a touch signal received from the electronic panel PN.

The wireless communication module TM may transmit/receive a wireless signal to/from the other terminal by using Bluetooth or Wi-Fi line. The wireless communication module TM may transmit/receive an audio signal by using a general communication line. The wireless communication module TM includes a transmitter TM1 modulating and transmitting a signal to be transmitted and a receiver TM2 demodulating the received signal.

The image input module IIM processes the image signal to convert the processed image signal into image data that is capable of being displayed on the electronic panel PN. The audio input module AIM receives external audio signals by using a microphone during recording mode or a voice recognition mode to convert the received audio signal into electrical sound data.

The external interface IF serves as an interface connected to an external charger, a wired/wireless data port, and a card socket (for example, a memory card and an SIM/UIM card).

The second electronic module EM2 may include an audio output module AOM, a light emitting module LM, a light receiving module LRM, and a camera module CMM. The above-described constituents may be directly mounted on the mother board, may be mounted on a separate board and electrically connected to the electronic panel PN through a connector (not shown), or may be electrically connected to the first electronic module EM1.

The audio output module AOM converts audio data received from the wireless communication module TM or audio data stored in the memory MM to output the converted audio data to the outside.

The light emitting module LM generates and outputs light. The light emitting module LM may output infrared rays. The light emitting module LM may include an LED. The light receiving module LRM may sense the infrared rays. The light receiving module LRM may be activated when infrared rays having a predetermined level or more is sensed. The light receiving module LRM may include a CMOS sensor. The infrared rays generated in the light emitting module LM may be outputted and then be reflected by an external object (for example, a user's finger or face), and the reflected infrared rays may be incident into the light receiving module LRM. The camera module CMM photographs an external image.

The electronic module EM of FIG. 2A may receive the external input transmitted through the module hole MH or provide an output through the module hole MH. The electronic module EM may be one of the modules constituting the first electronic module EM1 and the second electronic module EM2. For example, the electronic module EM may be a camera, a speaker, or a sensor that senses light or heat. The electronic module EM may sense an external object received through the module hole MH or provide a sound signal such as voice to the outside through the module hole MH. Here, the remaining constituents of the first electronic module EM1 and the second electronic module EM2 may be disposed at different positions and thus may not be illustrated. However, this is merely an example. The first electronic module EM may include a plurality of modules constituting the first electronic module EM 1 and the second electronic module EM2, but is not limited to a specific embodiment. Although not shown, the electronic apparatus EA according to an embodiment of the inventive concept may further include a transparent member disposed between the electronic module EM and the electronic panel PN. The transparent member may be an optically transparent film so that the external input transmitted through the module hole MH passes through the transparent member and is transmitted to the electronic module EM. The transparent member may be attached to the rear surface of the electronic panel PN or be disposed between the electronic panel PN and the electronic module EM without an adhesion layer. The electronic apparatus EA according to the inventive concept may have various shapes, but is not limited to a specific embodiment.

In the inventive concept, the electronic panel PN may include the module hole MH. Thus, a separate space provided from the electronic module EM outside the peripheral area NAA may be omitted. Also, the module hole MH may be defined in a hole area HA surrounded by the active area AA so that the electronic module EM is disposed to overlap the transmission area TA, but not the bezel area BZA. Thus, the bezel area BZA may be reduced in area to realize an electronic apparatus EA having a narrow bezel. Also, when the electronic module EM is accommodated in the module hole MH, a compact electronic apparatus EA may be realized.

Figure 3A:
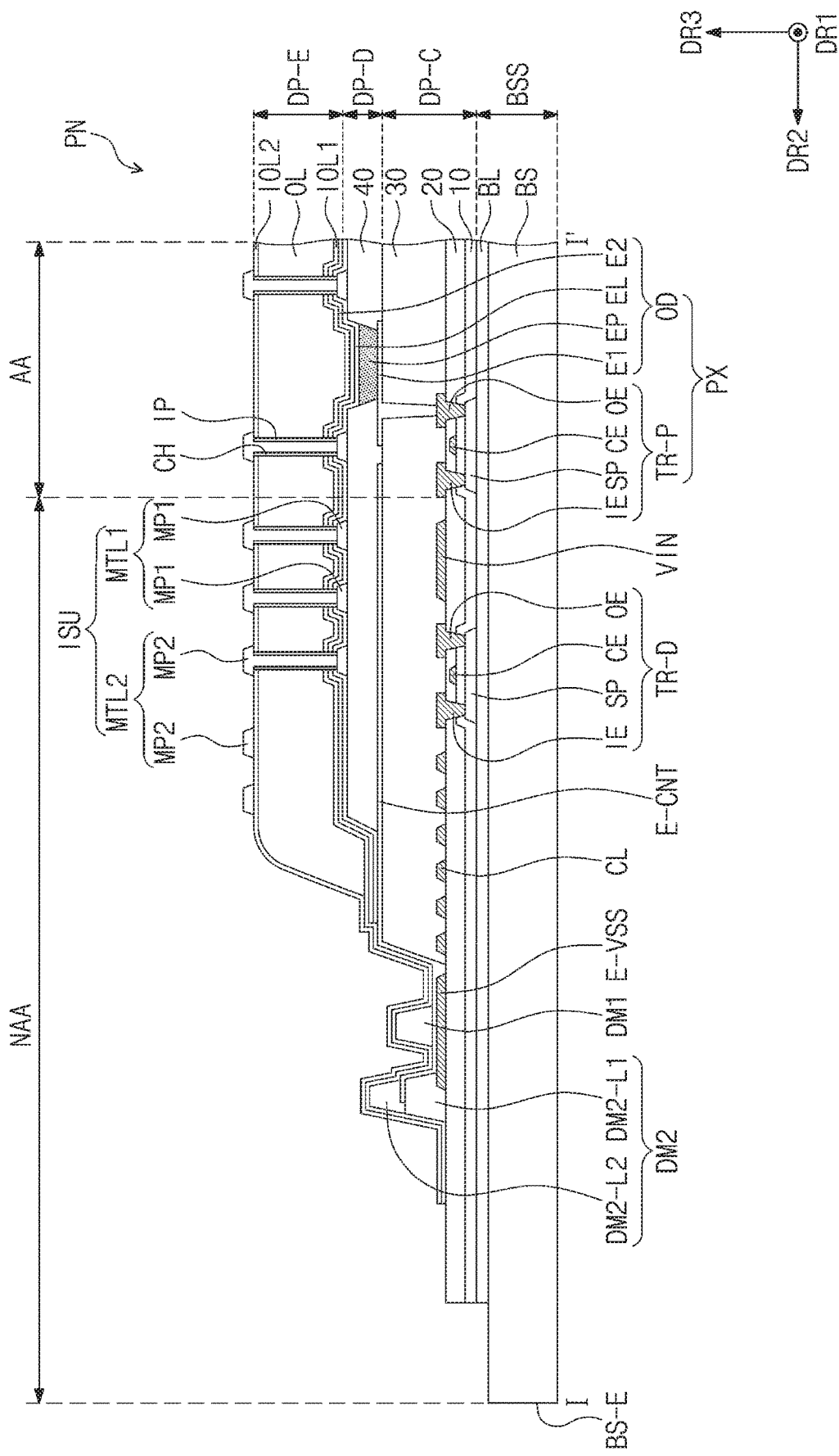
FIG. 3A is a cross-sectional view taken along line I-I' of FIG. 2A.
Figure 3B:
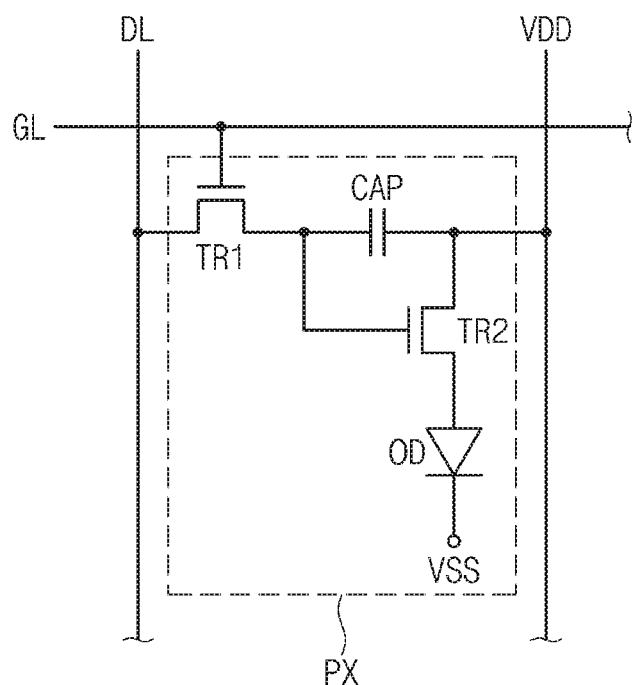
FIG. 3B is a schematic equivalent circuit view illustrating a portion of constituents of FIG. 3.

FIG. 3A is a cross-sectional view taken along line I-I' of FIG. 2A. FIG. 3B is a schematic equivalent circuit view illustrating a portion of the constituents of FIG. 3. Hereinafter, the present disclosure will be described with reference to FIGS. 3a and 3B.

The electronic panel PN may include a base substrate BSS, a circuit layer DP-C, a display device layer DP-D, an encapsulation layer DP-E, and an input sensing unit ISU. The circuit layer DP-C and the display device layer DP-D may include constituents of a pixel PX.

The pixel PX may be disposed on the active area AA. The pixel PX may generate light to realize the above-described image IM. The pixel PX may be provided in plurality and arranged on the active area AA.

Referring to FIG. 3B, the pixel PX may be connected to a plurality of signal lines. In this embodiment, a gate line GL, a data line DL, and a lower line VDD of the signal lines are illustrated as an example. However, this is merely an example. For example, the pixel PX according to an embodiment of the inventive concept may be additionally connected to various signal lines, but the inventive concept is not limited to a specific embodiment.

The pixel PX may include a first thin film transistor TR1, a capacitor CAP, a second thin film transistor TR2, and a light emitting device OD. The first thin film transistor TR1 may be a switching device that controls turn-on/off of the pixel PX. The first thin film transistor TR1 may transmit or block the data signal transmitted through the data line DL in response to the gate signal transmitted through the gate line GL.

The capacitor CAP is connected to the first thin film transistor TR1 and the power line VDD. The capacitor CAP charges electrical charges by an amount corresponding to a difference between the data signal received from the first thin film transistor TR1 and a first power voltage applied to the first power line VDD.

The second thin film transistor TR2 is connected to the first thin film transistor TR1, the capacitor CAP, and the light emitting device OD. The second thin film transistor TR2 controls driving current flowing through the light emitting device OD to correspond to an amount of charges stored in the capacitor CAP. A turn-on time of the second thin film transistor TFT2 may be determined according to the amount of charges charged in the capacitor CAP. The second thin film transistor TR2 provides the first power voltage transmitted through the power line VDD during the turn-on time to the light emitting device OD.

The light emitting device OD connects the second thin film transistor TR2 to the power terminal VSS. The light emitting device OD emits light as a voltage corresponding to a difference between the signal transmitted through the second thin film transistor TR2 and the second power voltage received through the power terminal VSS. The light emitting device OD may emit light during the turn-on time of the second thin film transistor TR2.

The light emitting device OD includes a luminescent material. The light emitting device OD may generate light having a color corresponding to the luminescent material. The color of the light generated in the light emitting device OD may have one of a red color, a green color, a blue color, and a white color.

FIG. 3A illustrates an example of one thin film transistor TR-P (hereinafter, referred to as a pixel transistor) and one light emitting device OD of the constituents of the pixel PX. The pixel transistor TR-P may correspond to the second thin film transistor TR2 of FIG. 2B.

The pixel transistor TR-P together with first to third insulation layers 10, 20, and 30 of a plurality of insulation layers may constitute the circuit layer DP-C. Each of the first to third insulation layers 10, 20, and 30 may include an organic material and/or an inorganic material and have a single layer or multilayered structure. The circuit layer DP-C is disposed on the base substrate BSS.

The base substrate BSS includes a base layer BS and an auxiliary layer BL. The base layer BS may be an insulation substrate. The base layer BS may be provided in a flexible state. For example, the base layer BS may include polyimide (PI). Alternatively, the base layer BS may be provided in a rigid state. For example, the base layer BS may be made of various material such as glass, plastic, and the like, but is not limited to a specific embodiment.

The auxiliary layer BL is disposed on the base layer BS. The auxiliary layer BL may be directly disposed on the base layer BS to cover the front surface of the base layer BS. Thus, a front surface of the auxiliary layer BL may be provided as the front surface of the base substrate BSS, and a rear surface of the base layer BS may be provided as the rear surface of the base substrate BSS.

The auxiliary layer BL includes an inorganic material. The auxiliary layer BL may include a barrier layer and/or a buffer layer. Thus, the auxiliary layer BL may prevent oxygen or moisture introduced through the base layer BS from being permeated into the circuit layer DP-C or the display device layer DP-D or may reduce surface energy of the base substrate BSS so that the circuit layer DP-C is stably formed on the base substrate BSS.

In the base substrate BSS, at least one of the base layer BS and the auxiliary layer BL may be provided in plurality and be alternately laminated. Alternatively, at least one of the barrier layer and the buffer layer constituting the auxiliary layer BL may be provided in plurality or may be omitted. However, this is merely an example. For example, the base substrate BSS according to an embodiment of the inventive concept may be realized according to various configurations, but the inventive concept is not limited to a specific embodiment.

The pixel transistor TR-P includes a semiconductor pattern SP, a control electrode CE, an input electrode IE, and an output electrode OE. The semiconductor pattern SP is disposed on the base substrate BSS. The semiconductor pattern SP may include a semiconductor material. The control electrode CE is spaced apart from the semiconductor pattern SP with the first insulation layer 10 therebetween. The control electrode CE may be connected to one electrode of each of the first thin film transistor TR1 and the capacitor CAP, which are described above.

The input electrode IE and the output electrode OE may be spaced apart from the control electrode CE with the second insulation layer 20 therebetween. The input electrode IE and the output electrode OE of the pixel transistor TR-P may be connected to one side and the other side of the semiconductor pattern SP by passing through the first insulation layer 10 and the second insulation layer 20, respectively.

The third insulation layer 30 may be disposed on the second insulation layer to cover the input electrode IE and the output electrode OE. In the pixel transistor TR-P, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer and be directly connected to the semiconductor pattern SP. The pixel transistor TR-P according to an embodiment of the inventive concept may have various structures, but the inventive concept is not limited to a specific embodiment.

The light emitting device OD is disposed on the circuit layer DP-C. The light emitting device may constitute the display device layer DP-D together with the fourth insulation layer 40 of the plurality of insulation layers. The light emitting device OD includes a first electrode E1, a light emitting pattern EP, an organic layer EL, and a second electrode E2. The fourth insulation layer 40 may include an organic material and/or an inorganic material and have a single layer or multilayered structure.

The first electrode E1 may be connected to the thin film transistor TR by passing through the third insulation layer 30. Although not shown, the display panel 100 may further include a separate connection electrode disposed between the first electrode E1 and the thin film transistor TR. Here, the first electrode E1 may be electrically connected to the thin film transistor TR through the connection electrode.

The fourth insulation layer 40 is disposed on the third insulation layer 30. An opening may be defined in the fourth insulation layer 40. The opening may expose at least a portion of the first electrode E1. The fourth insulation layer 40 may be a pixel defining layer.

The light emitting pattern EP may be disposed on the opening and disposed on the first electrode E1 exposed by the opening. The light emitting pattern EP may include a luminescent material. For example, the light emitting pattern EP may be made of at least one material of materials that emit light having red, green, and blue colors and include fluorescent material or a phosphorescent material. The light emitting pattern EP may include an organic luminescent material and an inorganic luminescent material. The light emitting pattern EP may emit light in response to a difference in potential between the first electrode E1 and the second electrode E2.

The control layer EL is disposed between the first electrode E1 and the second electrode E2. The control layer EL is disposed adjacent to the light emitting pattern EP. The control layer EL controls movement of the charges to improve luminous efficiency and lifetime of the light emitting device OD. The control layer EL may include at least one of hole transport material, a hole injection material, an electron transport material, and an electron injection material.

In this embodiment, the control layer EL may be disposed between the light emitting pattern EP and the second electrode E2. However, this is merely an example. For example, the control layer EL may be disposed between the light emitting pattern EP and the first electrode E1 and may be provided as a plurality of layers that are laminated in the third direction DR3 with the light emitting pattern EP therebetween.

The control layer EL may have an integrated shape that extends from the active area AA to the peripheral area NAA. The control layer EL may be commonly provided to the plurality of pixels.

The second electrode E2 is disposed on the light emitting pattern EP. The second electrode E2 may face the first electrode E1. The second electrode E2 may have an integrated shape that extends from the active area AA to the peripheral area NAA. The second electrode E2 may be commonly provided to the plurality of pixels. The light emitting device OD disposed on each of the pixels may receive a common power voltage (hereinafter, referred to as a second power voltage) through the second electrode E2.

The second electrode E2 may include a transmissive conductive material or a transflective conductive material. Thus, the light generated in the light emitting pattern EP may be easily emitted in the third direction DR3 through the second electrode E2. However, this is merely an example. For example, the light emitting device OD according to an embodiment of the inventive concept may be driven in a bottom emission manner including a transmissive or semi-transmissive material or may be driven in a double-side emission manner in which light is emitted from all of the front and rear surfaces, but the inventive concept is not limited to a specific embodiment.

The encapsulation layer DP-E may be disposed on the light emitting device OD to encapsulate the light emitting device OD. The encapsulation layer DP-E may have an integrated shape that extends from the active area AA to the peripheral area NAA. The encapsulation layer DP-E may be commonly provided to the plurality of pixels. Although not shown, a capping layer covering the second electrode E2 may be further disposed between the second electrode E2 and the encapsulation layer DP-E.

The encapsulation layer DP-E may include a first inorganic layer IOL1, an organic layer OL, and a second inorganic layer IOL2, which are sequentially laminated in the third direction DR3. However, the inventive concept is not limited thereto. For example, the encapsulation layer DP-E may further include a plurality of inorganic layers and organic layers.

The first inorganic layer IOL1 may cover the second electrode E2. The first inorganic layer IOL1 may prevent external moisture or oxygen from being permeated into the light emitting device OD. For example, the first inorganic layer IOL1 may include silicon nitride, silicon oxide, or a combination thereof. The first inorganic layer IOL1 may be formed through a deposition process.

The organic layer OL may be disposed on the first inorganic layer IOL1 to contact the first inorganic layer TOLL The organic layer OL may provide a flat surface on the first inorganic layer TOLL A curve formed on a top surface of the first inorganic layer IOL1 or particles existing on the first inorganic layer IOL1 may be covered by the organic layer OL to prevent the surface state of the top surface of the first inorganic layer IOL1 from having an influence on the constituents disposed on the organic layer OL. Also, the organic layer OL may reduce stress between the layers contacting each other. The organic layer OL may include an organic material and be formed through a solution process such as spin coating, slit coating, inkjet process, and the like.

The second inorganic layer IOL2 may be disposed on the organic layer OL to cover the organic layer OL. The second inorganic layer IOL2 may be relatively stably formed on the flat surface when compared to the second inorganic layer IOL2 disposed on the first inorganic layer TOLL The second inorganic layer IOL2 may encapsulate moisture discharged from the organic layer OL to prevent the moisture from being introduced. The second inorganic layer IOL2 may include silicon nitride, silicon oxide, or a combination thereof. The second inorganic layer IOL2 may be formed through a deposition process.

The input sensing unit ISU may include a first conductive layer MTL1 and a second conductive layer MTL2. The first conductive layer MTL1 may be disposed below the encapsulation layer DP-E. Particularly, the first conductive layer MTL1 is disposed between the fourth insulation layer 40 and the control layer EL.

The first conductive layer MTL1 may include a conductive material. For example, the first conductive layer MTL1 may include at least one of a metal, a transparent conductive oxide, or a conductive polymer.

The first conductive layer MTL1 includes a plurality of first conductive patterns MP1. The first conductive patterns MP1 may be disposed to be spaced apart from the light emitting pattern EP. The first conductive patterns MP1 may not overlap the light emitting pattern EP on the plane. The first conductive patterns MP1 may be arranged on the fourth insulation layer 40 and covered by the control layer EL.

The second conductive layer MTL2 is disposed on the encapsulation layer DP-E. In this embodiment, the second conductive layer MTL2 may be directly disposed on a top surface of the second inorganic layer IOL2. However, this is merely an example. For example, a separate insulation layer such as a buffer layer may be further disposed between the second conductive layer MTL2 and the second inorganic layer IOL2.

The second conductive layer MTL2 may include a conductive material. For example, the first conductive layer MTL1 may include at least one of a metal, a transparent conductive oxide, or a conductive polymer.

The second conductive layer MTL2 includes a plurality of second conductive patterns MP2. The second conductive patterns MP2 may be disposed to be spaced apart from the light emitting pattern EP on the plane. The second conductive patterns MP2 may not overlap the light emitting pattern EP on the plane.

In this embodiment, a portion of the second conductive patterns MP2 may be electrically connected to the first conductive patterns MP1 through a contact hole CH passing through the encapsulation layer DP-E. Particularly, the contact hole CH may pass through the encapsulation layer DP-E, the second electrode E2, and the control layer EL to extend up to a top surface of each of the first conductive patterns MP1. At least a portion of the second conductive patterns MP2 may be connected to each of the conductive patterns corresponding to the first conductive patterns MP1 through the contact hole CH.

Each of the first conductive patterns MP1 may serve as a bridge electrode. Here, the portions of the second conductive patterns MP2, which are spaced apart from each other, may be electrically connected to each other through the first conductive patterns MP1. Alternatively, each of the first conductive patterns MP1 may serve as a sensor electrode. Here, the second conductive patterns MP2 and the first conductive patterns MP1 may be connected to each other to increase in an area of the sensor electrode, thereby improving external input sensing sensitivity.

This is merely an example. For example, the first conductive patterns MP1 and the second conductive patterns MP2 may be electrically insulated from each other. Here, the first conductive patterns MP1 and the second conductive patterns MP2 may serve as sensor electrodes that receive electrical signals different from each other. The input sensing unit ISU may sense the external input through a variation in capacitance generated between the first conductive patterns MP1 and the second conductive patterns MP2. In the input sensing unit ISU according to the inventive concept, the connection between the first conductive patterns MP1 and the second conductive patterns MP2 may be variously realized according to functions of the first conductive patterns MP1 and the second conductive patterns MP2. This will be described below in more detail.

An inner insulation layer IP covering a side surface of the contact hole CH may be disposed in the contact hole CH. The inner insulation layer IP may prevent the second inorganic layer IOL2, the organic layer OL, the first inorganic layer IOL1, the second electrode E2, and the control layer EL, which are exposed to the side surface of the contact hole CH, from contacting the second conductive patterns MP2. Thus, electrical connection between other conductive materials, for example, the second electrode E2 and the second conductive patterns MP2 except for the electrical connection between the second conductive patterns MP2 and the first conductive patterns MP1 may be prevented from occurring.

In the present disclosure, the input sensing unit ISU may include a first conductive layer MTL1 and a second conductive layer MTL2, which are spaced apart from each other with the encapsulation layer DP-E therebetween. Also, the first conductive layer MTL1 and the second conductive layer MTL2 may be disposed to be spaced apart from each other with the second electrode E2 of the light emitting device OD, which is one constituent of the display unit DPU, therebetween.

That is, according to the inventive concept, one constituent of the input sensing unit ISU may be disposed between the constituents of the display unit DPU. Thus, in the electronic panel PN including the input sensing unit ISU and the display unit DPU, the process may be simplified, and the process cost may be reduced. This will be described later in detail.

The electronic panel PN according to an embodiment of the inventive concept may further include a thin film transistor TR-D (hereinafter, referred to as a driving transistor) disposed on the peripheral area NAA, a plurality of signal patterns E-VSS, E-CNT, VIN, and CL, and a plurality of dam parts DM1 and DM2. The driving transistor TR-D and the signal patterns E-VSS, E-CNT, VIN, and CL may constitute the circuit layer DP-C.

The driving transistor TR-D having a structure corresponding to the pixel transistor TR-P is illustrated as an example. For example, the driving transistor TR-D may include a semiconductor pattern SP disposed on the base substrate BSS, a control electrode CE disposed on the first insulation layer 10, an input electrode IE disposed on the second insulation layer 20, and an output electrode OE. Thus, the pixel transistor TR-P and the driving transistor TR-D may be formed through the same process at the same time, and thus, the process may be simplified, and the process cost may be reduced. However, this is merely an example. For example, the driving transistor TR-D according to an embodiment of the inventive concept may have a structure different from that of the pixel transistor TR-P, but is not limited to a specific embodiment.

The signal patterns E-VSS, E-CNT, VIN, and CL may include a power supply line E-VSS, a connection electrode E-CNT, an initialization voltage line VIN, and a driving signal line CL. The power supply line E-VSS may correspond to the power terminal of the pixel PX. Thus, the power supply line E-VSS supplies a second power voltage to the light emitting device OD. In this embodiment, the second power voltages supplied to the pixels PX may be a common voltage with respect to all of the pixels PX.

The power supply line E-VSS may be disposed on the second insulation layer 20 to constitute the circuit layer DP-C. The power supply line E-VSS may be formed through the same process as the input electrode IE or the output electrode OE of the driving transistor TR-D. However, this is merely an example. For example, the power supply line E-VSS may be disposed on a layer that is different from that of the input electrode IE and the output electrode OE of the driving transistor TR-D and thus be formed through a separate process, but the inventive concept is not limited to a specific embodiment.

The connection electrode E-CNT may be disposed on the third insulation layer 30 to constitute the display device layer DP-D. The connection electrode E-CNT is electrically connected to the power supply line E-VSS. The connection electrode E-CNT may extend from a top surface of the third insulation layer 30 to cover a top surface of the power supply line E-VSS exposed from the third insulation layer 30.

The second electrode E2 of the light emitting device OD extends from the display area DA and is connected to the connection electrode E-CNT. The connection electrode E-CNT may receive the second power voltage from the power supply line E-VSS. Thus, the second power voltage may be transmitted to the second electrode E2 through the connection electrode E-CNT and be provided to each of the pixels.

The connection electrode E-CNT may be disposed on the same layer as the first electrode E1 of the light emitting device OD and thus be formed at the same time with the first electrode E1. However, this is merely an example. For example, the connection electrode E-CNT and the first electrode E1 may be disposed on layers different from each other.

The driving signal line CL may be provided in plurality and disposed on the second insulation layer 20. The driving signal line CL may be disposed on the peripheral area NDA. The driving signal line CL may be a routing line connected to a pad (not shown) or a line constituting the integrated circuit IC. The driving signal lines CL may be disposed to be spaced apart from each other in the first direction DR to independently transmit electrically signals.

The initialization voltage line VIN may be disposed on the display area DA to provide an initialization voltage to the pixel PX. Although not shown, the initialization voltage line VIN may be provided in plurality to provide the initialization voltage to each of the pixels PX.

The driving signal line CL and the initialization voltage line VIN may be disposed on the same layer and formed through the same process at the same time. However, this is merely an example. For example, the driving signal line CL and the initialization voltage line VIN may be independently formed through separate processes, but is not limited to a specific embodiment.

The dam parts DM1 and DM2 are disposed on the peripheral area NDA. The dam parts DM1 and DM2 may prevent the organic layer OL from overflowing from the display area DA to the outside of the dam parts DM1 and DM2, for example, in a direction that is opposite to the second direction DR2 in FIG. 3B when the organic layer OL of the encapsulation layer TFE is formed. The dam parts DM1 and DM2 may be disposed adjacent to at least one side of the display area DA. The dam parts DM1 and DM2 may surround the display area DA on the plane. The dam parts DM1 and DM2 may be provided in plurality and include a first dam part DM1 and a second dam part DM2.

The first dam part DM1 may be disposed relatively closer to the display area DA than the second dam part DM2. The first dam part DM1 may be disposed to overlap the power supply line E-VSS on the plane. In this embodiment, the connection electrode E-CNT may pass between the first dam part DM1 and the power supply line E-VSS on a cross-section.

In this embodiment, the first dam part DM1 may be made of the same material as the fourth insulation layer 40, and the first dam part DM1 and the fourth insulation layer 40 may be formed at the same time by one mask. Thus, a separate process of forming the first dam part DM1 may not be required to reduce the process cost and simplify the process.

The second dam part DM2 may be disposed at the outside relative to the first dam part DM1. The second dam part DM2 may be disposed on a position at which a portion of the power supply line E-VSS is covered. In this embodiment, the second dam part DM2 may have a multilayered structure including a first layer DM2-L1 and a second layer DM2-L2. For example, the first layer DM2-L1 and the third insulation layer 30 may be formed at the same time, and the second layer DM2-L2 and the fourth insulation layer 40 may be formed at the same time. Thus, even though a separate process is not additionally performed, the second dam part DM2 may be easily formed.

In this embodiment, the connection electrode E-CNT may be disposed to partially overlap the first layer DM2-L1 of the second dam part DM2. The connection electrode E-CNT may have an end that is inserted between the first layer DM2-L1 and the second layer DM2-L2. However, this is merely an example. For example, the connection electrode E-CNT may not extend up to the second dam part DM2, but the inventive concept is not limited to a specific embodiment.

The first inorganic layer IOL1 and the second inorganic layer IOL2 may extend from the active area AA to the outside of the second dam part DM2. The first inorganic layer IOL1 and the second inorganic layer IOL2 may cover the first dam part DM1 and the second dam part DM2. The organic layer OL may be disposed inside the second dam part DM2. However, this is merely an example. For example, a portion of the organic layer OL may extend up to an area overlapping the first dam part DM1, but the inventive concept is not limited to a specific embodiment.

Figure 4A:
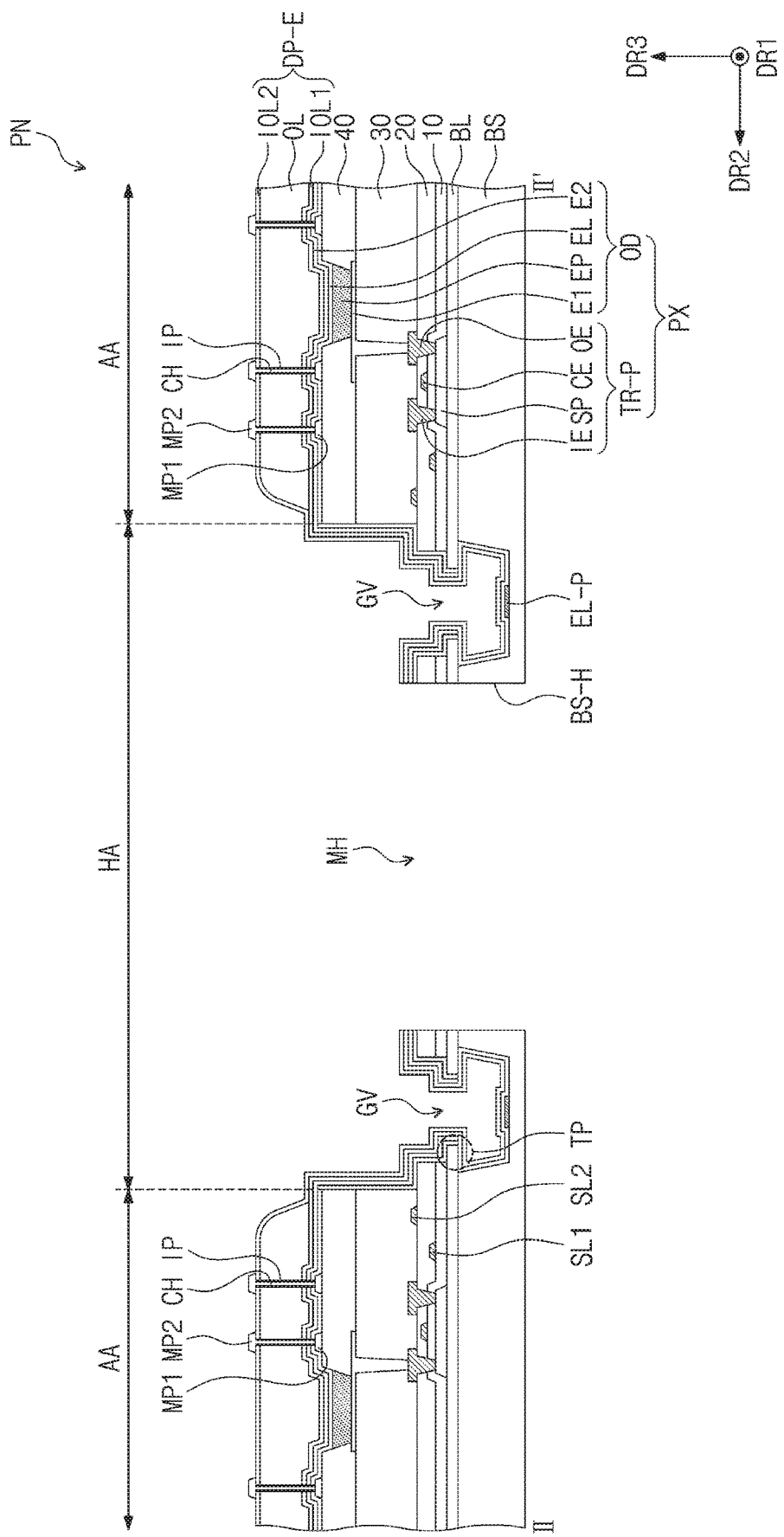
FIG. 4A is a cross-sectional view taken along line II-II' of FIG. 2A.
Figure 4B:
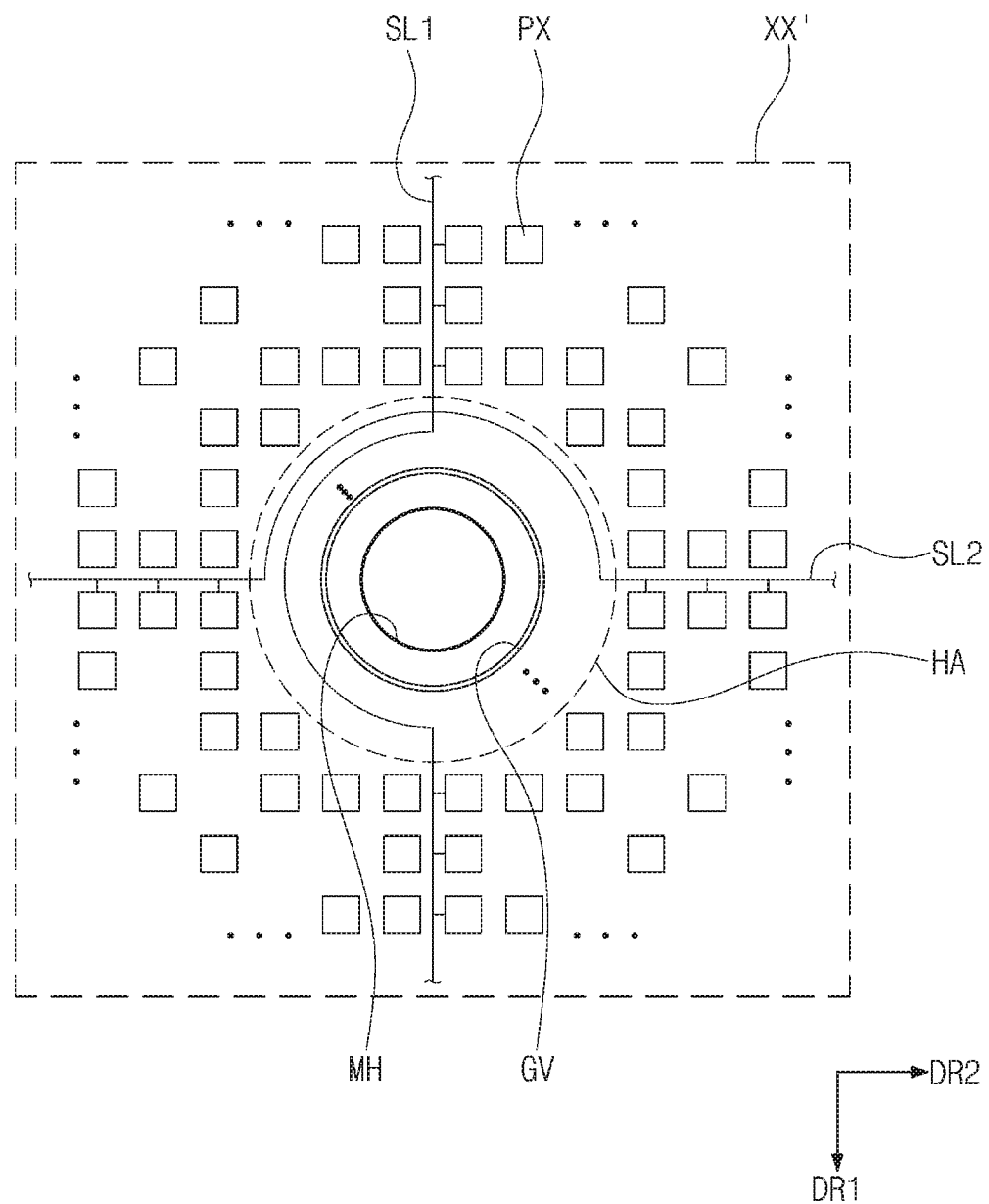
FIGS. 4B and 4C are plan views illustrating an area XX' of FIG. 2A.
Figure 4C:
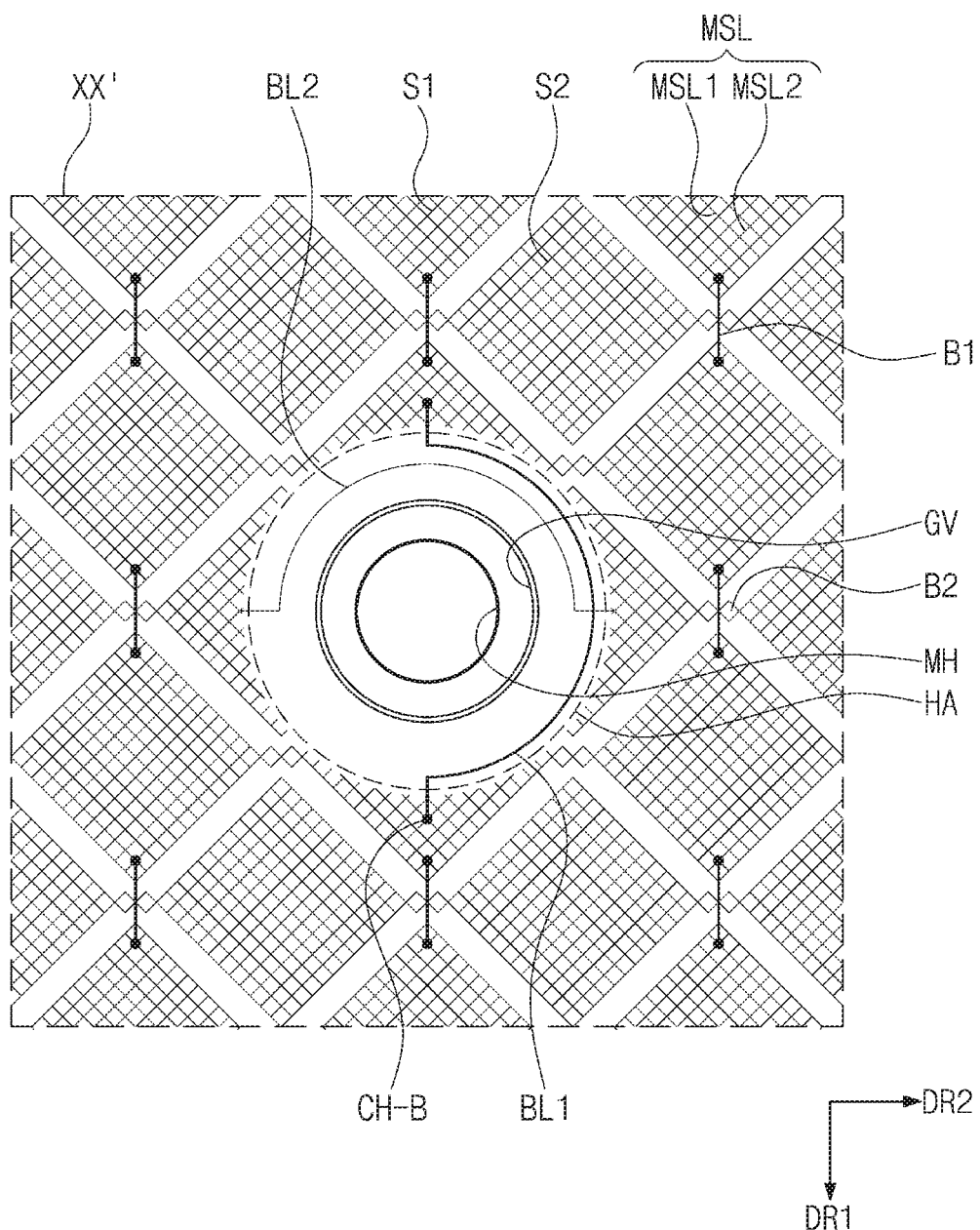

FIG. 4A is a cross-sectional view taken along line II-IF of FIG. 2A. FIGS. 4B and 4C are plan views illustrating an area XX' of FIG. 2A. FIG. 4A may substantially correspond to a cross-sectional view of the area XX'. In FIGS. 4B and 4C, a portion of the constituents of the electronic panel PN is briefly illustrated. Particularly, FIG. 4A illustrates the pixels PX, and FIG. 4B illustrates the input sensing unit ISU (see FIG. 3B). Hereinafter, the present disclosure will be described with reference to FIGS. 4A to 4C.

The hole area HA may be surrounded by the active area AA on the plane. In FIGS. 3A an 3B, for convenience of description, the hole area HA is shown by a dotted line. The pixels PX may be disposed to be spaced apart from the module hole MH, and a portion of the pixels PX, which is disposed adjacent to the hole area HA, may be disposed along an edge of the hole area HA.

Referring to FIG. 4A, the module hole MH is defined in the hole area HA. The module hole MH may be defined in a center of the hole area HA. The module hole MH may be a through-hole to pass through the electronic panel PN. The module hole MH passes through the front and rear surfaces of the base substrate BSS. Particularly, the module hole MH passes through the constituents, which are disposed on the hole area HA, on the layers disposed on the front surface of the base substrate BSS. Thus, the first insulation layer 10, the second insulation layer 20, the third insulation layer 30, the control layer EL, the first inorganic layer IOL1, the second inorganic layer 10L2, which extend up to the hole area HA, may be penetrated to define a side surface of the module hole MH.

The electronic panel PN according to this embodiment may further include a recess pattern GV defined in the hole area HA. The recess pattern GV may be defined along an edge of the module hole MH. In this embodiment, the recess pattern GV is illustrated as a close line surrounding the module hole MH and has a circular shape similar to that of the module hole MH. However, this is merely an example. For example, the recess pattern GV may have a shape different from that of the module hole MH, may have a close line shape including a polygonal shape, an oval shape, or at least partial circular shape, or may be provided in a shape including a plurality of partially cut patterns, but the inventive concept is not limited to a specific embodiment.

The recess pattern GV may be a pattern that is recessed from the front surface of the electronic panel PN. A portion of the constituents of the electronic panel PN may be removed to form the recess pattern GV. The recess pattern GV may not pass through the electronic panel PN unlike the module hole MH. Thus, the rear surface of the bass substrate BSS overlapping the recess pattern GV may not be opened by the recess pattern GV.

The recess pattern GV may be defined to pass through the rest constituents except for a portion of the base layer BS. In this embodiment, the recess pattern GV may be formed by connecting the through-part defined in the auxiliary layer BL to the recess part defined in the base layer BS. An inner surface of the recess pattern GV may be covered by the first inorganic layer IOL1 and the second inorganic layer 10L2.

The recess pattern GV may have an under-cut shape including a tip part TP protruding inward. The tip part TP according to this embodiment may be formed so that a portion of the auxiliary layer BL further protrudes to the inside of the recess pattern GV than the base layer BS. The electronic panel PN according to an embodiment of the inventive concept may have various layer structures as long as the tip part TP is provided on the recess pattern GV, but the inventive concept is not limited to a specific embodiment.

The electronic panel PN may further include a predetermined organic pattern EL-P disposed in the recess pattern GV. The organic pattern EL-P may be made of the same material as the control layer EL. Alternatively, the organic pattern EL-P may further include the same material as the second electrode E2. The organic pattern EL-P may have a single layer or multilayered structure.

The organic pattern EL-P may be disposed in the recess pattern GV by being spaced apart from the control layer EL and the second electrode E2. The organic pattern EL-P may be covered by the first inorganic layer IOL1 and thus may not be exposed to the outside.

According to the inventive concept, the recess pattern GV cuts off the continuity of the control layer EL connected from the side surface of the module hole MH to the active area AA. The control layer EL may be disconnected at the area overlapping the recess pattern GV. The control layer EL may serve as a moving path for external contaminations such as moisture or air. The layer exposed by the module hole MH, for example, a path through which the moisture or air introduced from the control layer EL is introduced into the active area AA via the hole area HA may be covered by the recess pattern GV. Thus, the electronic panel PN in which the module hole MH is defined may be improved in reliability.

In the electronic panel PN according to an embodiment of the inventive concept, the recess pattern GV may be provided in plural, which are spaced apart from each other in the second direction DR2, and a portion of the organic layer OL may extend to fill a portion of the recess pattern GV. In the electronic panel PN according to an embodiment of the inventive concept, the recess pattern GV may be omitted, but the inventive concept is not limited to a specific embodiment.

As described above, the pixels PX and the input sensing unit ISU are disposed to be spaced apart from the module hole MH on the plane. Hereinafter, referring to FIGS. 4B and 4C, the module hole MH and the pixels PX and the input sensing unit ISU in the vicinity of the module hole MH will be described.

Referring to FIG. 4B, the pixels PX may be arranged to surround the hole area HA. Portions of the pixels PX may be arranged along an edge of the hole area HA. The pixels PX may be spaced apart from the module hole MH on the plane.

A plurality of signal lines SL1 and SL2 connected to the pixels PX may be disposed on the hole area HA. The signal lines SL1 and SL2 may be connected to the pixels PX via the hole area HA. In FIG. 4A, for convenience of description, an example in which a first signal line SL1 and a second signal line SL2 of the plurality of signal lines connected to the pixels PX are illustrated.

The first signal line SL1 extends in the first direction DR1. The first signal line SL1 is connected to the pixels within the same row arranged in the first direction DR1 of the pixels PX. The first signal line SL1 may correspond to the data line DL (see FIG. 3B).

A portion of the pixels PX connected to the first signal line SL1 may be disposed above the module hole MH, and other portion of the pixels PX may be disposed below the module hole MH. Thus, the pixels within the same row connected to the first signal line SL1 may receive a data signal through the same line even though a portion of the pixels with respect to the module hole MH is omitted.

The second signal line SL2 extends in the second direction DR2. The second signal line SL2 is connected to the pixels within the same row arranged in the second direction DR2 of the pixels PX. The second signal line SL2 may correspond to the gate line GL (see FIG. 3B).

A portion of the pixels PX connected to the second signal line SL2 may be disposed at the left side of the module hole MH, and other portion of the pixels PX may be disposed at the right side of the module hole MH. Thus, the pixels within the same row connected to the second signal line SL2 may be turned on/off by substantially the same gate signal even though a portion of the pixels with respect to the module hole MH is omitted.

The electronic panel PN according to an embodiment of the inventive concept may further include a connection pattern disposed on the hole area HA. Here, the first signal line SL1 may be disconnected at the area overlapping the hole area HA. The connected portion of the first signal line SL may be connected through the connection pattern. Similarly, the second signal line SL2 may be disconnected at the area overlapping the hole area HA, and a connection pattern connecting the disconnected portion of the second signal line may be further provided.

Referring to FIG. 4C, the input sensing unit ISU may include a first sensing electrode extending in the first direction DR1 and a second sensing electrode extending in the second direction DR2. The input sensing unit ISU receives position or intensity information of the external input through a variation in capacitance between the first sensing electrode and the second sensing electrode. In this embodiment, the first sensing electrode may include a first sensing pattern S1 and a first bridge pattern B1, and the second sensing electrode may include a second sensing pattern S2 and a second bridge pattern B2.

The first sensing pattern S1 may be provided in plurality and arranged to be spaced apart from each other. The first sensing pattern S1 may include a plurality of mesh lines MSL crossing the first direction DR1 and the second direction DR2. The mesh lines MSL may include a first mesh line MSL1 extending in one direction and a second mesh line MSL2 extending in a direction crossing the first mesh line MSL1. The first mesh line MSL1 and the second mesh line MSL2 may be connected to each other to form the first sensing pattern S1 having a net shape.

The first bridge pattern B1 extends in the first direction DR1. The first bridge pattern B1 may be provided in plurality and arranged to connect two first sensing patterns arranged to be adjacent to each other in the first direction DR1. The first sensing patterns S1 may be connected to each other through the first bridge pattern B1 to serve as the first sensing electrode extending in the first direction DR1.

The second sensing pattern S2 is spaced apart from the first sensing pattern S1. The second sensing pattern S2 may be provided in plurality and arranged to be spaced apart from each other. The second sensing pattern S2 may have the same shape as the first sensing pattern S1. Particularly, the second sensing pattern S2 may include the plurality of mesh lines MSL including the first mesh line MSL1 and the second mesh line MSL2. The input sensing unit ISU according to an embodiment of the inventive concept may include the first sensing pattern S1 and the second sensing pattern S2 to improve flexibility. However, this is merely an example. For example, the second sensing pattern S2 may have a shape different from that of the first sensing pattern S1, but the inventive concept is not limited to a specific embodiment.

The second bridge pattern B2 extends in the second direction DR2. The second bridge pattern B2 may be provided in plurality and arranged to connect two second sensing patterns arranged to be adjacent to each other in the second direction DR2. The second sensing patterns S2 may be connected to each other through the second bridge pattern B2 to serve as the second sensing electrode extending in the second direction DR2.

In this embodiment, the first sensing pattern S1, the second sensing pattern S2, and the second bridge pattern B2 may be disposed on the same layer, and the first bridge pattern B1 may be disposed on a different layer. Thus, the first sensing pattern S1, the second sensing pattern S2, and the second bridge pattern B2 may be formed at the same time by using the same mask. The first bridge pattern B1 and the second bridge pattern B2 may be disposed on layers different from each other. Thus, even though the first bridge pattern S1 and the second bridge pattern B2 are disposed to cross each other on the plane, the first bridge pattern S1 and the second bridge pattern B2 may be electrically insulated from each other. The first sensing pattern S1 may be connected to the first bridge pattern B1 through a predetermined contact hole, and the second sensing pattern S2 may be directly connected to the second bridge pattern B2.

In this embodiment, a portion of the first sensing electrode and the second sensing electrode may be disconnected with respect to the module hole MH. For example, a portion of the first sensing electrode may be separated into an upper portion and a lower portion with respect to the module hole MH. A portion of the first sensing pattern S1 may have a shape in which a portion overlapping the hole area HA is removed. Alternatively, for example, a portion of the second sensing electrode may be separated into a left portion and a right portion with respect to the module hole MH. A portion of the second sensing pattern S2 may have a shape in which a portion overlapping the hole area HA is removed.

In the electronic panel PN according to an embodiment of the inventive concept, the input sensing unit ISU may further include a first bridge line BL1 and a second bridge line BL2. The first bridge line BL1 and the second bridge line BL2 may electrically connect the sensing electrodes, which are disconnected via the hole area HA, to each other. Particularly, the first bridge line BL1 connects the first sensing electrode, which is separated into the upper and lower portions, to each other, and the second bridge line BL2 connects the second sensing electrode, which are separated into the left and right portions, to each other.

The first bridge line BL1 and the second bridge line BL2 may be disposed on layers different from each other. In this embodiment, the first bridge line BL1 may be disposed on the same layer as the first bridge pattern B1, and the second bridge line BL2 may be disposed on the same layer as the second bridge pattern B2. Thus, the first bridge line BL1 may be connected to the first sensing pattern S1 through a predetermined contact hole CH-B, and the second bridge line BL2 may be directly connected to the second sensing pattern S2. However, this is merely an example. For example, the input sensing unit ISU according to an embodiment of the inventive concept may have various structures, but is not limited to a specific embodiment.

In this embodiment, the mesh lines MSL, the first bridge pattern B1, the second bridge pattern B2, the first bridge line BL1, and the second bridge line BL2 may correspond to the conductive patterns MP1 and MP2, respectively. Particularly, each of the first conductive patterns MP1 and the second conductive patterns MP2 may be the first mesh line MSL1 or the second mesh line MSL2. Alternatively, each of the first conductive patterns MP1 and the second conductive patterns MP2 may be the first bridge line BL1 or the second bridge line BL2.

In the electronic panel PN according to the inventive concept, the pixels PX or the sensing patterns S1 and S2, which are spaced apart from each other with respect to the module hole MH, may be connected to each other through the signal lines SL1 and SL2 or the bridge lines BL1 and BL2 to maintain the organic coupling between th pixels PX or the sensing patterns S1 and S2, which are spaced apart from each other with respect to the module hole MH, thereby facilitating the electrical control of the pixels PX. Thus, even though the module hole MH is defined in the area that is surrounded by the active area AA, the electronic panel PN in which the active area AA is stably driven may be provided.

Figure 5A:
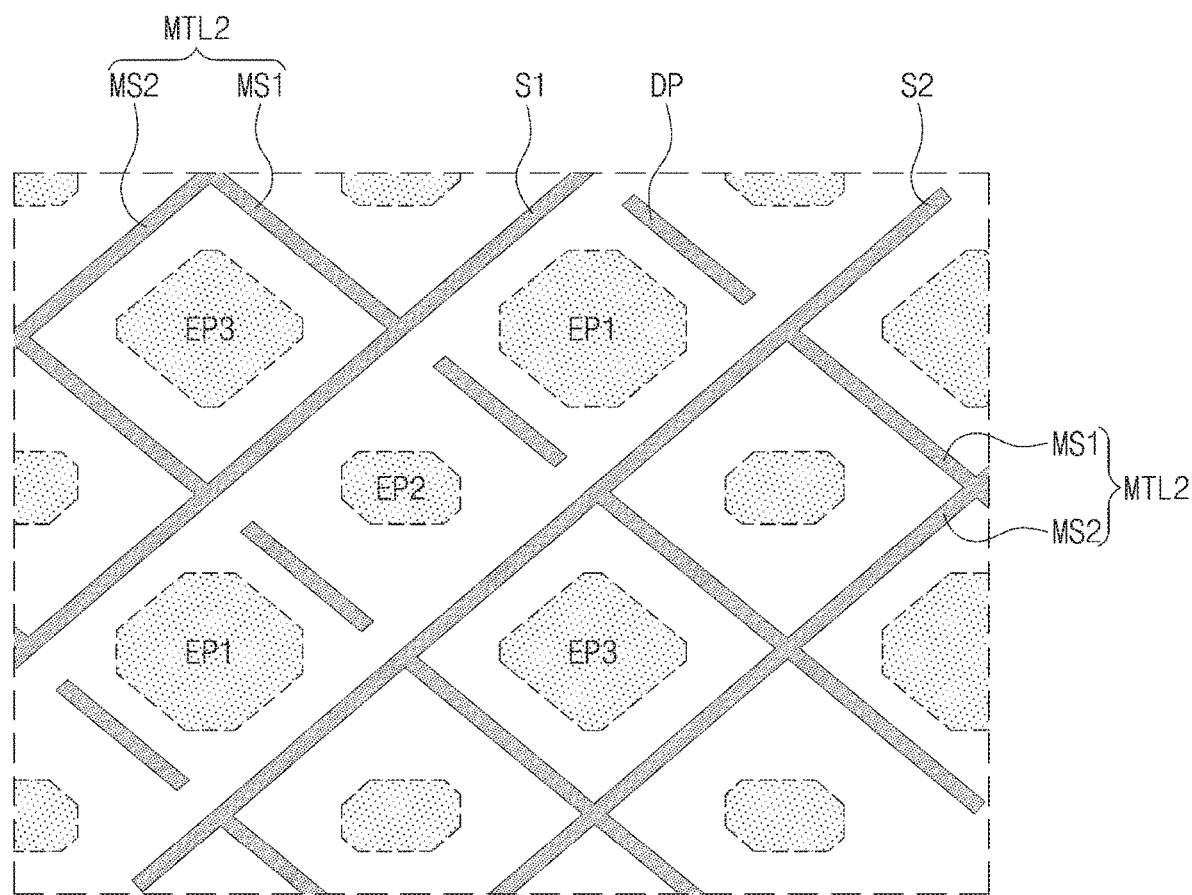
FIG. 5A is a plan view illustrating a portion of an area of an electronic panel according to an embodiment of the inventive concept.
Figure 5B:
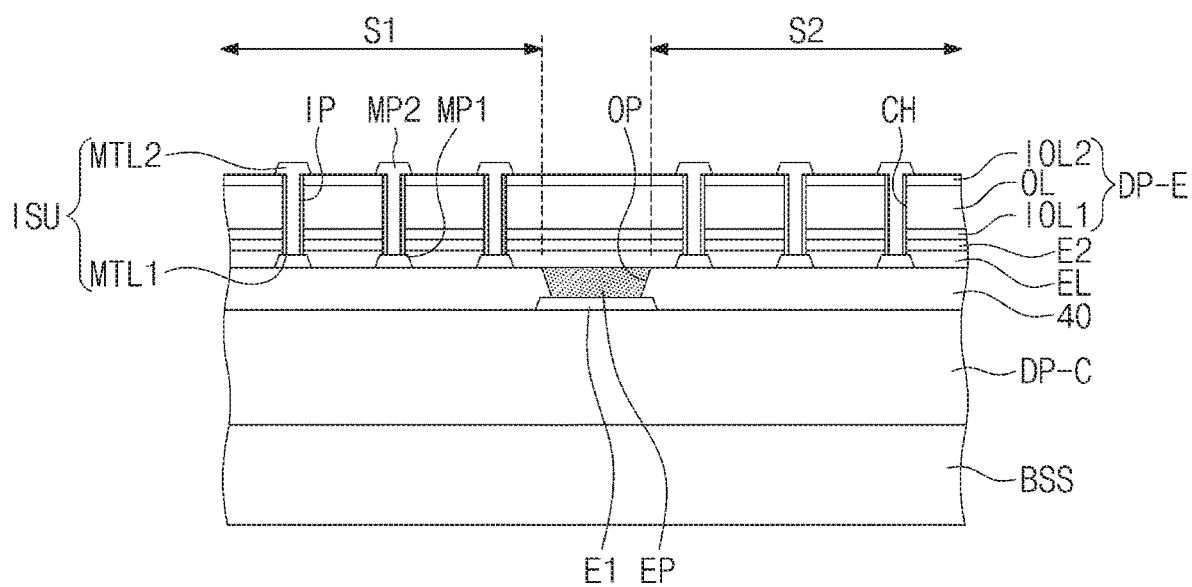
FIG. 5B is a cross-sectional view illustrating a portion of the area of the electronic panel according to an embodiment of the inventive concept.

FIG. 5A is a plan view illustrating a portion of an area of an electronic panel according to an embodiment of the inventive concept. FIG. 5B is a cross-sectional view illustrating a portion of the area of the electronic panel according to an embodiment of the inventive concept. FIG. 5A illustrates a plan view of an electronic panel PN when viewed from a front side. Also, for convenience of description, portions of constituents of FIGS. 5A and 5B are omitted.

As illustrated in FIGS. 5A and 5B, a second conductive layer MTL2 disposed on the uppermost layer on a front surface of the electronic panel PN is illustrated. The second conductive layer MTL2 includes a first sensing pattern S1 and a second sensing pattern S2, which are spaced apart from each other. Each of the first sensing pattern S1 and the second sensing pattern S2 may include a first mesh pattern MS1 and a second mesh pattern MS2. The first mesh pattern MS1 and the second mesh pattern MS2 may correspond to second conductive patterns MP2, respectively.

The first mesh pattern MS1 and the second mesh pattern MS2 may be spaced apart from light emitting patterns EP1, EP2, and EP3 on a plane. The light emitting pattern EP of FIG. 5B may be one of a first light emitting pattern EP1, a second light emitting pattern EP2, and a third light emitting pattern EP3. That is, second conductive patterns MP2 may not overlap the light emitting patterns EP1, EP2, and EP3 on the plane.

According to the inventive concept, even though a second conductive layer MTL2 is optically opaque, an influence of the second conductive layer MTL2 on display characteristics of the light emitting patterns EP1, EP2, and EP3 may be prevented. However, this is merely an example. For example, the second conductive layer MTL2 may overlap a portion of the light emitting patterns EP1, EP2, and EP3 and may be provided to be optically opaque and disposed to overlap the light emitting pattern EP1, EP2, and EP3, but is not limited to a specific embodiment.

The input sensing unit according to an embodiment of the inventive concept may further include a dummy pattern DP. The dummy pattern DP may be disposed in a spaced space between the first sensing pattern S1 and the second sensing pattern S2. The dummy pattern DP may prevent a boundary between the first sensing pattern S1 and the second sensing pattern S2 from being easily visible to deteriorate visibility of the input sensing unit.

In FIG. 5A, the plurality of light emitting patterns are shown by a dotted line. The light emitting patterns include a first light emitting pattern EP1, a second light emitting pattern EP2, and a third light emitting pattern EP3. Light emitted from the first light emitting pattern EP1, the second light emitting pattern EP2, and the third light emitting pattern EP3 may have colors different from each other. The first light emitting pattern EP1, the second light emitting pattern EP2, and the third light emitting pattern EP3 may have shapes different from each other on the plane. However, this is merely an example. For example, the first light emitting pattern EP1, the second light emitting pattern EP2, and the third light emitting pattern EP3 may have the same shape, and the light emitted from the first light emitting pattern EP1, the second light emitting pattern EP2, and the third light emitting pattern EP3 may have the same color, but the inventive concept is not limited to a specific embodiment.

Referring to FIGS. 5A and 5B, each of the first sensing pattern S1 and the second sensing pattern S2 may have substantially a double layer structure including the first conductive layer MTL1 and the second conductive layer MTL2. Thus, the first conductive layer MTL1 and the second conductive layer MTL2 constituting the first sensing pattern S1 and the first conductive layer MTL1 and the second conductive layer MTL2 constituting the second sensing pattern S2 may have the same shape.

The first conductive patterns MP1 may be disposed to spaced apart from an opening OP of the fourth insulation layer, in which the light emitting pattern EP is disposed. The first conductive layer MTL1 and the second conductive layer MTL2 constituting the first sensing pattern S1 and the first conductive layer MTL1 and the second conductive layer MTL2 constituting the second sensing pattern S2 may be electrically connected to each other through a contact hole CH passing through an encapsulation layer DP-E.

In this embodiment, a second electrode E2 may overlap the first sensing pattern S1, the second sensing pattern S2, and the light emitting pattern EP on the plane. Thus, the contact hole CH may also pass through the second electrode E2. An inner insulation layer IP may cover a side surface of the contact hole CH to interrupt the electrical connection between the second electrode E2 and the input sensing unit ISU.

According to the inventive concept, the input sensing unit ISU may include the first sensing pattern S1 and the second sensing pattern S2, which respectively include the first conductive layer MTL1 and the second conductive layer MTL2. Thus, the first conductive patterns MP1 and the second conductive patterns MP2 may be connected to each other through the contact hole CH passing through the encapsulation layer DP-E and the second electrode E2.

The input sensing unit ISU according to an embodiment of the inventive concept may include the second electrode E2 constituting the display unit DPU (see FIG. 2B) and the first and second conductive layers MTL1 and MTL2 spaced apart from each other with the encapsulation layer DP-E therebetween. According to the inventive concept, a portion of the constituents of the input sensing unit ISU may be disposed between the constituents of the display unit DPU to reduce a thickness of the electronic panel and improve integration of the electronic panel on a cross-section.

Figure 6A:
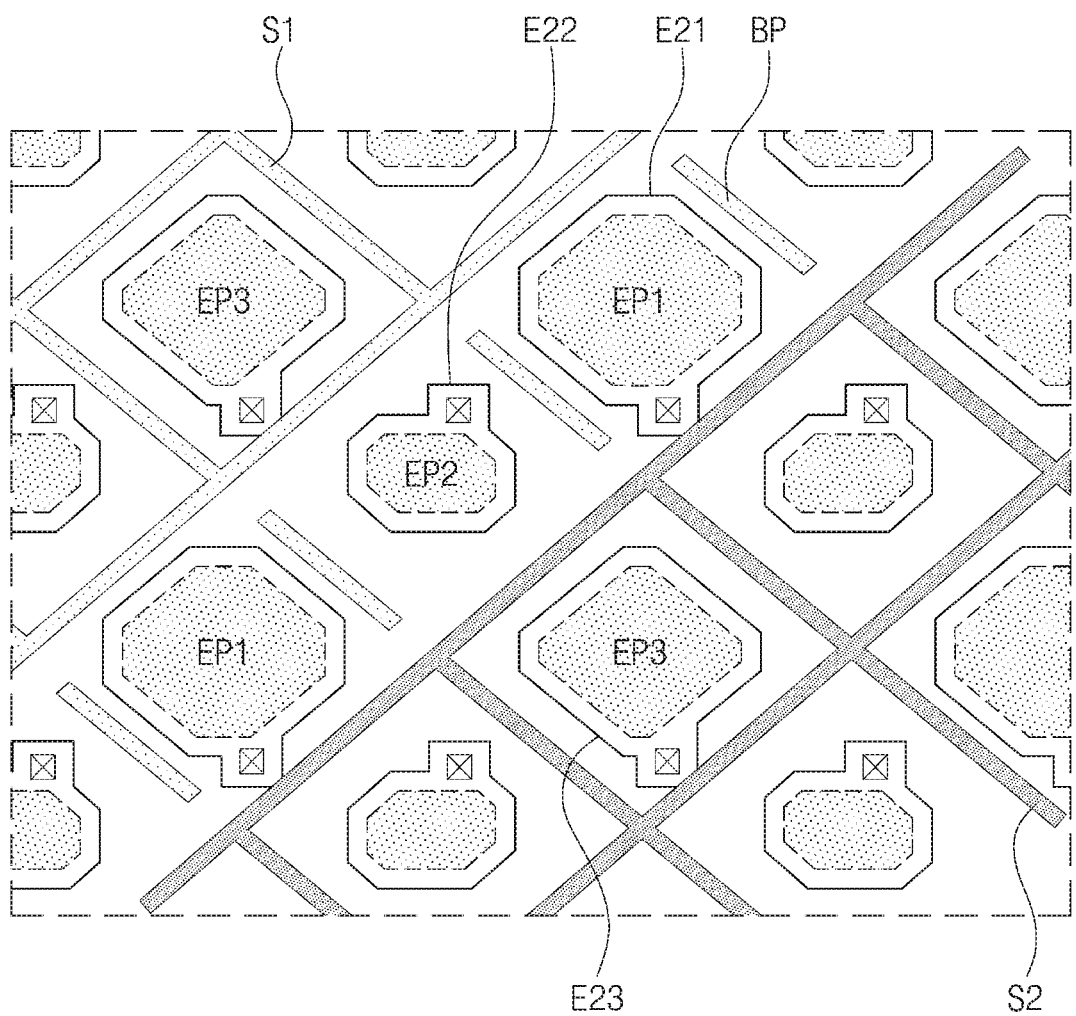
FIG. 6A is a plan view illustrating a portion of an area of an electronic panel according to an embodiment of the inventive concept.
Figure 6B:
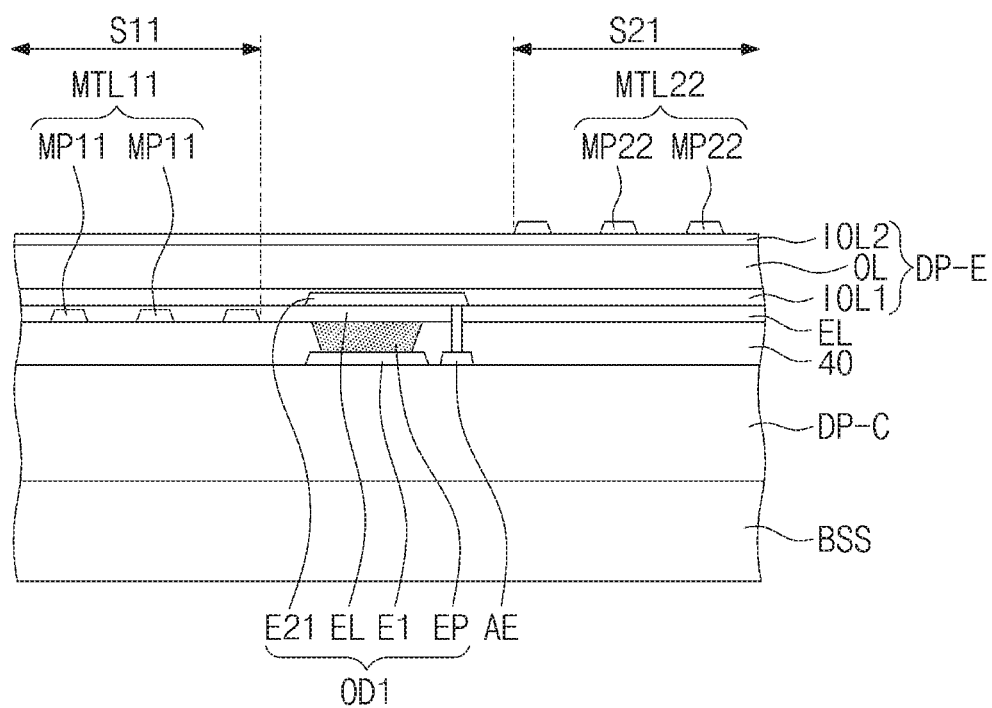
FIG. 6B is a cross-sectional view illustrating a portion of the area of the electronic panel according to an embodiment of the inventive concept.

FIG. 6A is a plan view illustrating a portion of an area of an electronic panel according to an embodiment of the inventive concept. FIG. 6B is a cross-sectional view illustrating a portion of the area of the electronic panel according to an embodiment of the inventive concept. FIG. 6A illustrates an area corresponding to FIG. 5A, and FIG. 6B illustrates an area corresponding to FIG. 5B. Hereinafter, the present disclosure will be described with reference to FIGS. 6A and 6B. The same reference numeral may be given to components that are the same as those of FIGS. 1 to 5B, and their detailed descriptions will be omitted.

In an electronic panel according to an embodiment of the inventive concept, a first sensing pattern S1 and a second sensing pattern S2 may be disposed on layers different from each other. For convenience of description, FIG. 6A illustrates a state in which shade of the first sensing pattern S1 and the second sensing pattern S2, which are disposed on different layers, are differently displayed.

As illustrated in FIG. 6B, a first sensing pattern S11 may include a first conductive layer MTL11. The first conductive layer MTL11 includes a plurality of first conductive patterns MP11. The first conductive patterns MP11 is disposed between a fourth insulation layer 40 and a control layer EL. A second sensing pattern S21 may include a second conductive layer MTL21. The second conductive layer MTL21 includes a plurality of second conductive patterns MP21. The second conductive patterns MP21 is disposed on an encapsulation layer DP-E.

In the input sensing unit according to this embodiment, the first sensing pattern S1 and the second sensing pattern S2 may be provided as the conductive layers MTL11 and MTL21 that are spaced apart from each other with the encapsulation layer DP-E therebetween. Thus, a contact hole CH (see FIG. 5B) passing through the encapsulation layer DP-E may be omitted.

In this embodiment, a second electrode may be disposed for each light emitting patterns and include a plurality of patterns spaced apart from each other. For convenience of description, a first pattern E21, a second pattern E22, and a third pattern E23 are illustrated. The first pattern E21, the second pattern E22, and the third pattern E23 may be disposed to overlap the first light emitting pattern EP1, the second light emitting pattern EP2, and the third light emitting pattern EP3, respectively.

FIG. 6B illustrates a light emitting device OD1 including the first pattern E21. The first pattern E21 may be connected to an auxiliary electrode AE that passes through the control layer EL and the fourth insulation layer 40 and is disposed to be spaced apart from the first electrode E1. The first pattern E21 may receive an electrical signal that is opposite to that of the first electrode E1 through the auxiliary electrode AE. The auxiliary electrode AE may extend between the light emitting patterns EP1, EP2, and EP3 and may also be connected to the second pattern E22 and the third pattern E23. Thus, the first to third patterns E21, E22, and E23, which are separated from each other, may be connected to one auxiliary electrode AE to receive substantially the same electrical signal.

According to the inventive concept, the first conductive layer MTl11 and the second conductive layer MTL21, which are disposed on different layers with the encapsulation layer DP-E therebetween may be respectively provided by the first sensing pattern S1 and the second sensing pattern S2 to reduce a thickness of the electronic panel and improve integration of the electronic panel. Also, the second electrode may be provided by the plurality of patterns E21, E22, and E23 to reduce an influence of the second electrode on capacitance between the first sensing pattern S1 and the second sensing pattern S2. Thus, the electronic panel having adequate sensitivity with respect to external input sensing may be provided.

Figure 7A:
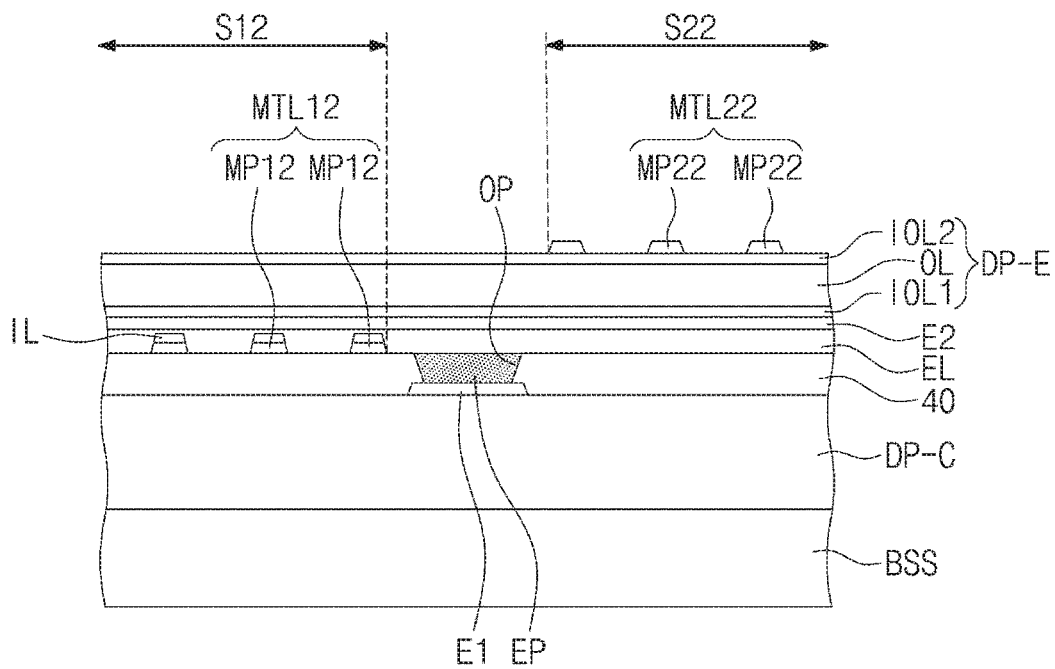
FIGS. 7A and 7B are cross-sectional views of the electronic panel according to an embodiment of the inventive concept.
Figure 7B:
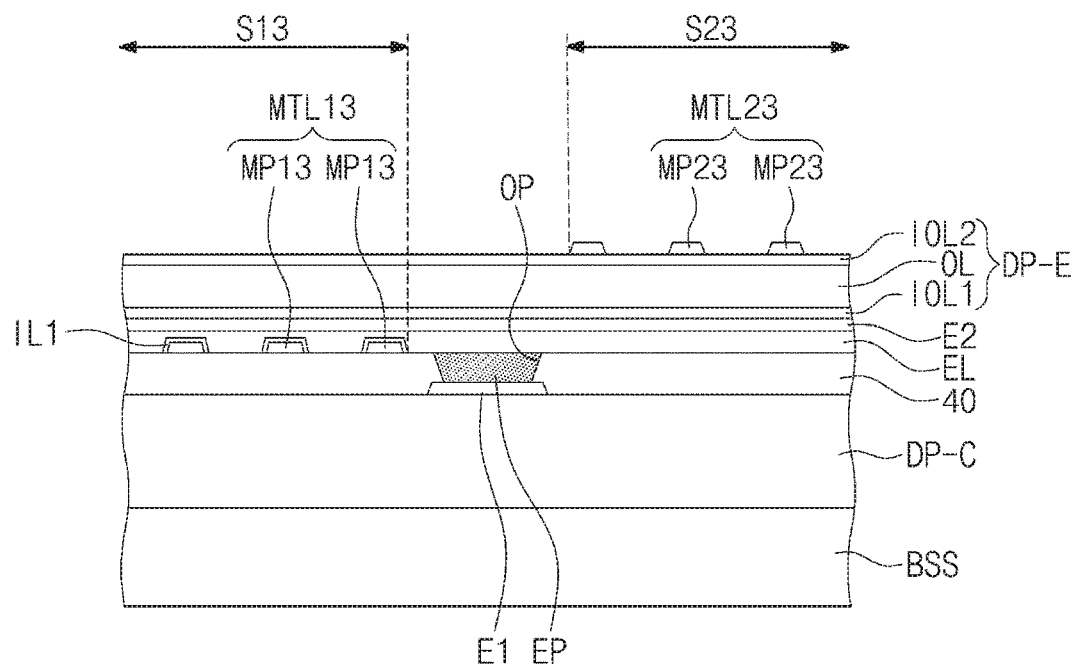

FIGS. 7A and 7B are cross-sectional views of the electronic panel according to an embodiment of the inventive concept. For convenience of description, FIGS. 7A and 7B illustrate an area corresponding to that of FIG. 6B. Hereinafter, the present disclosure will be described with reference to FIGS. 7A and 7B. The same reference numeral may be given to components that are the same as those of FIGS. 1 to 6B, and their detailed descriptions will be omitted.

As illustrated in FIG. 7A, the first sensing pattern S12 includes the first conductive layer MTL12, and the second sensing pattern S12 includes the second conductive layer MTL22. The second conductive layer MTL22 includes a plurality of second conductive patterns MP22 disposed on the encapsulation layer DP-E. Since this structure corresponds to the second conductive patterns MP21 of FIG. 6B, their duplicated description will be omitted.

The first conductive layer MTL12 may include a plurality of first conductive patterns MP12 and a plurality of insulation patterns IL. The insulation patterns IL may be disposed on the first conductive patterns MP12. The insulation patterns IL may contact the first conductive patterns MP12, and the insulation patterns IL may respectively cover top surfaces of the first conductive patterns MP12. The insulation patterns IL may improve electrical insulation between the constituents adjacent to the first conductive patterns MP12, for example, the second electrodes E2.

Alternatively, as illustrated in FIG. 7B, a first sensing pattern S13 includes a first conductive layer MTL13, and a second sensing pattern S13 includes a second conductive layer MTL23. The second conductive layer MTL23 includes a plurality of second conductive patterns MP23 disposed on the encapsulation layer DP-E. Since this structure corresponds to the second conductive patterns MP21 of FIG. 6B, their duplicated description will be omitted.

The first conductive layer MTL13 may include a plurality of first conductive patterns MP13 and a plurality of insulation patterns IL. Insulation patterns IL1 may be disposed on the first conductive patterns MP13. The insulation patterns IL1 may contact the first conductive patterns MP12, and the insulation patterns IL may respectively cover top surfaces of the first conductive patterns MP13.

According to the inventive concept, the electronic panel may further include the insulation patterns IL and IL1 covering the first conductive patterns MP12 and MP13 to prevent short-circuit between the second electrode E2 and the first conductive layers MTL12 and MTL13 and defects of a parasitic cap from occurring. Thus, the electronic panel may be improved in electrical characteristic and reliability.

FIGS. 8A to 8M are cross-sectional views illustrating a process of manufacturing an electronic panel according to an embodiment of the inventive concept. FIGS. 9A to 9E are cross-sectional views illustrating a process of manufacturing an electronic panel according to an embodiment of the inventive concept. FIGS. 8A to 8M illustrates cross-sectional views illustrating a process of manufacturing the areas of FIG. 4A, and FIGS. 9A to 9E illustrates cross-sectional views of an area corresponding to an area YY' of FIG. 8M. Hereinafter, the present disclosure will be described with reference to FIGS. 8A to 9E. The same reference numeral may be given to components that are the same as those of FIGS. 1 to 7B, and their detailed descriptions will be omitted.

Figure 8A:
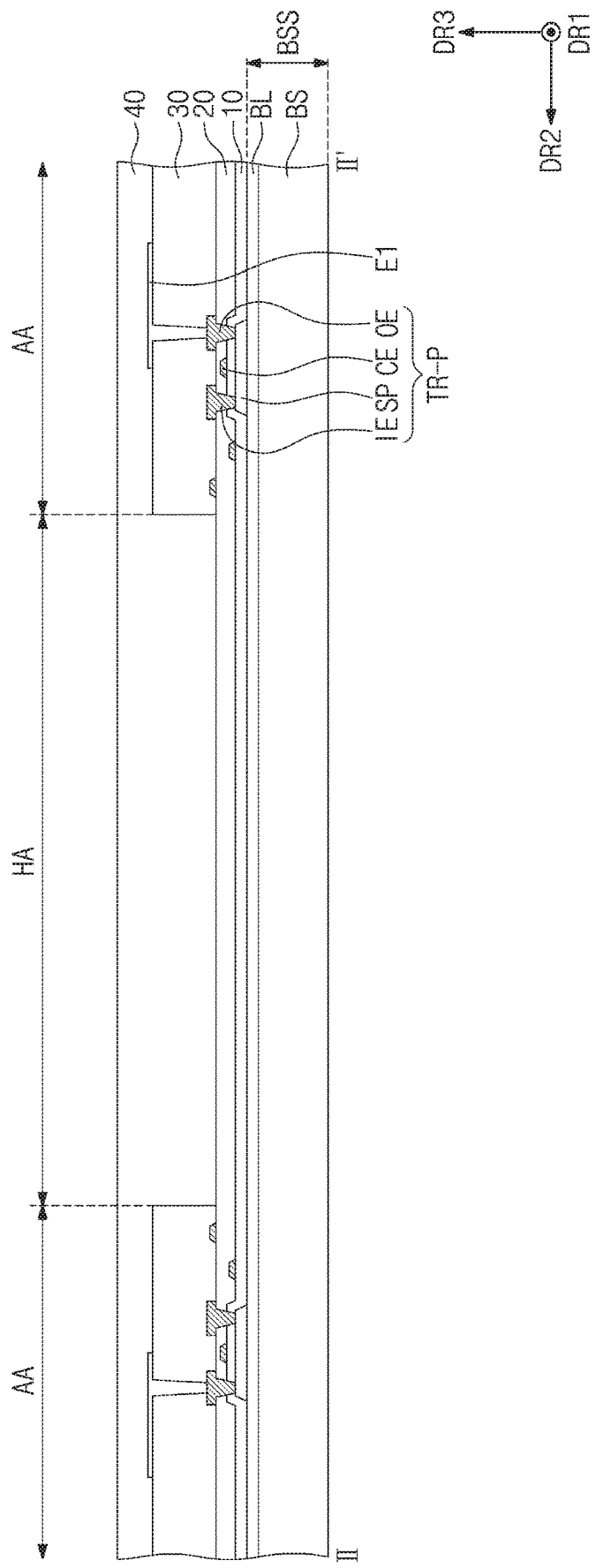

As illustrated in FIG. 8A, a thin film transistor TR-P, a plurality of insulation layers 10, 20, 30, and 40, and an electrode E1 are formed on a base substrate BSS. The base substrate BSS may be provided to form auxiliary layer BL on a base layer BS by depositing or applying an inorganic material. The thin film transistor TR-P may be formed through a general thin film transistor manufacturing process including a deposition or patterning process, but is not limited to a specific embodiment. The electrode E1 may be formed after forming a through-hole exposing an output electrode OE in a third insulation layer 30. Here, an area corresponding to a hole area HA may be removed. Thereafter, an insulation material may be deposited or applied to form a fourth insulation layer 40. Here, the fourth insulation layer 40 may overlap the entire hole area HA or active area AA.

Figure 8B:
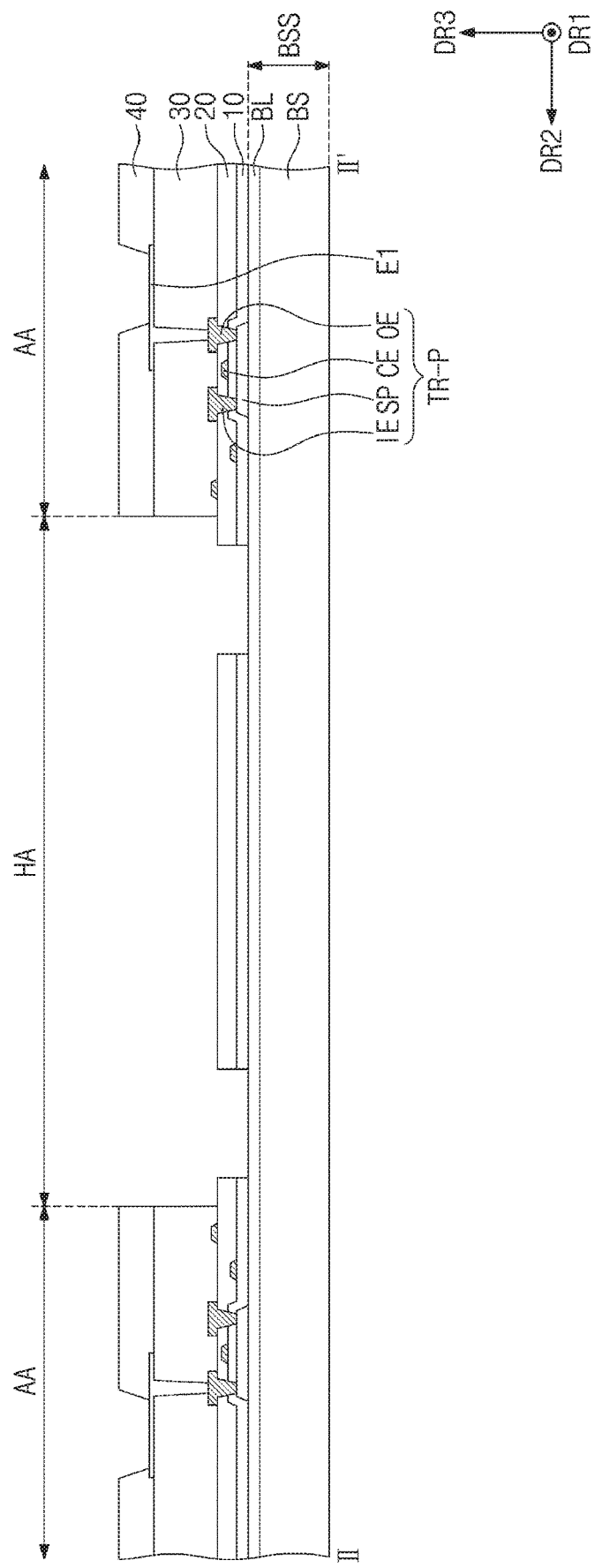

Thereafter, as illustrated in FIG. 8B, the fourth insulation layer 40 may be patterned to form an opening OP exposing a portion of the first electrode E1. A light emitting pattern that will be formed later may be formed in the opening OP. Thus, the opening OP may correspond to a light emitting area. Here, an area corresponding to the hole area HA may also be removed. Here, a portion of each of the first and second insulation layers 10 and 20 may be removed to form a predetermined opening. The opening may have a circular shape in the hole area HA on the plane. Also, a groove pattern GV may be formed in the opening later.

Figure 8C:
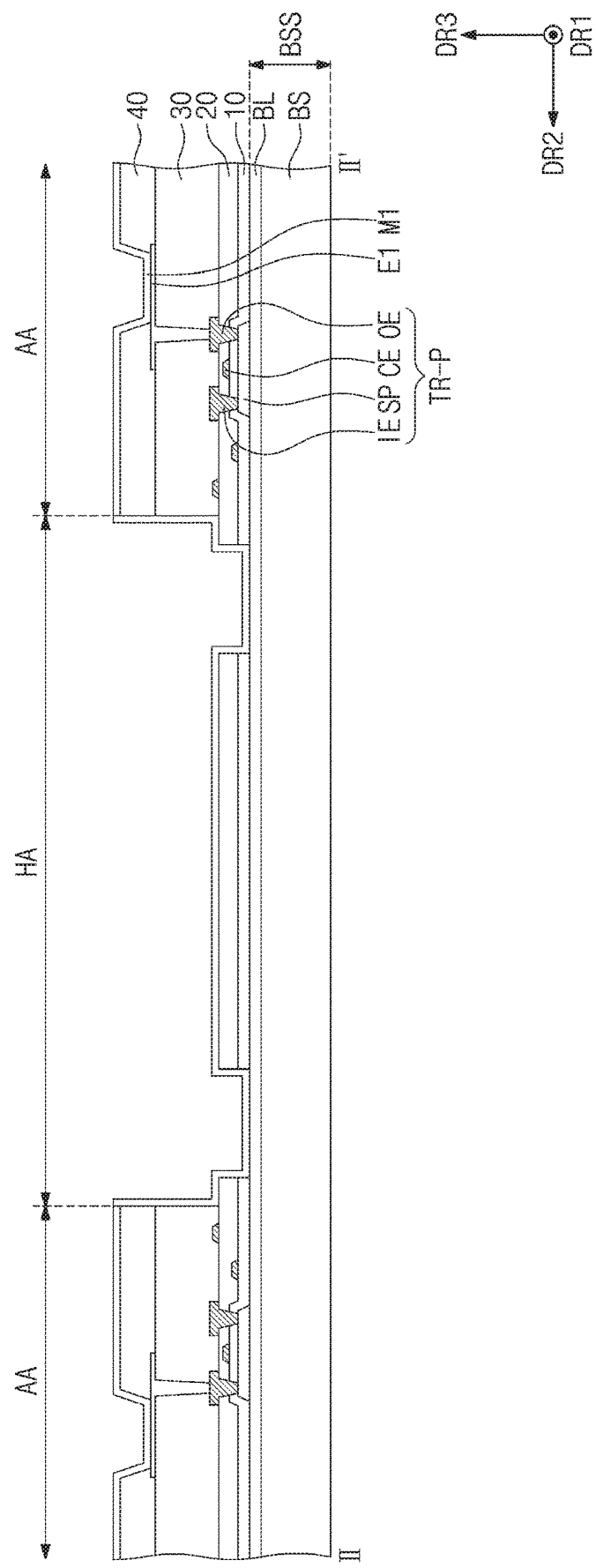

Thereafter, as illustrated in FIG. 8C, a first mask layer M1 is formed on the fourth insulation layer 40. The first mask layer M1 may be formed by depositing or applying a conductive material. The first mask layer M1 may entirely cover the active area and the hole area HA and also be formed in the openings in which the insulation layers are formed. The conductive material may include various materials having conductivity. For example, the first mask layer M1 may be formed of at least one of a metal, a transparent conductive oxide, or a conductive polymer.

Figure 8D:
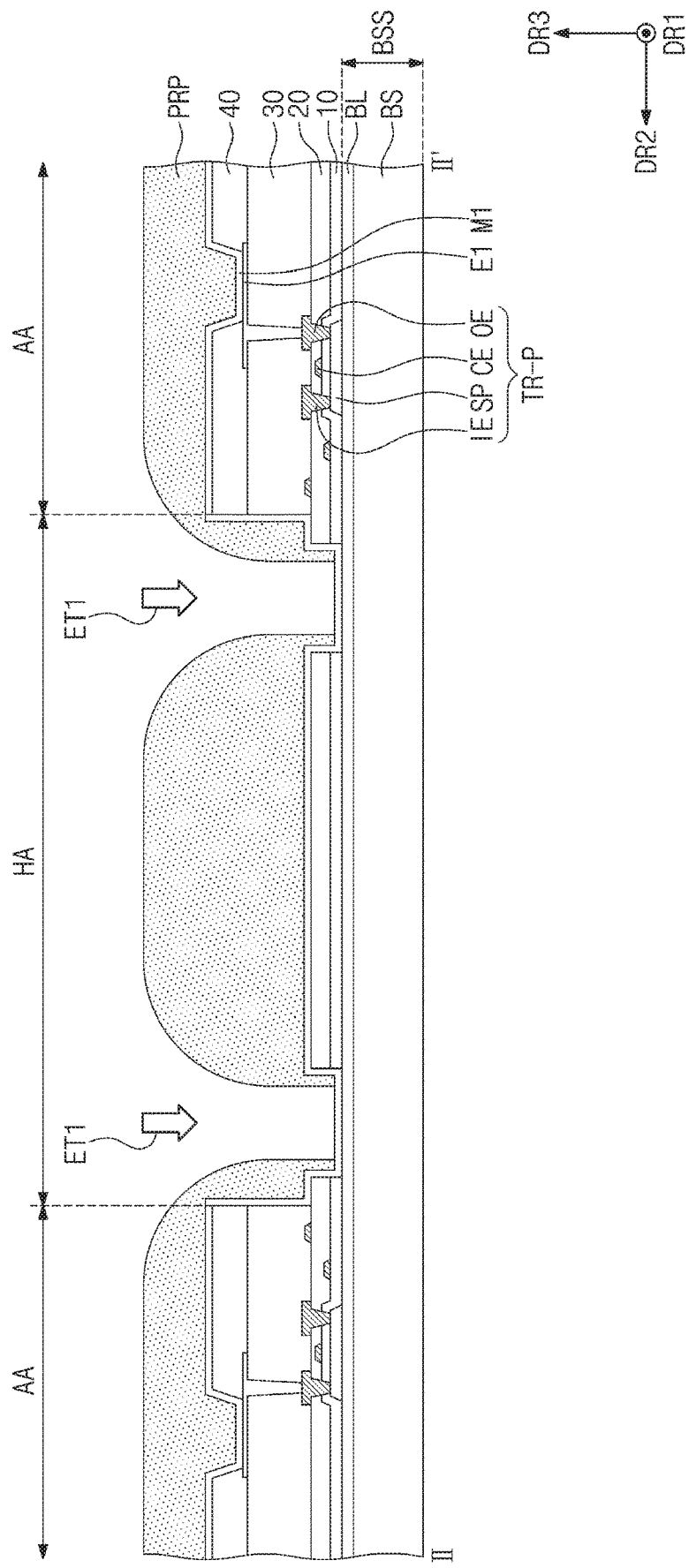

Thereafter, as illustrated in FIGS. 8D and 8E, a photoresist pattern PRP is formed on the first mask layer M1 and then is patterned to form a second mask layer M2. The second mask layer M2 may be formed by forming an opening OP-M, which is defined in the hole area HA, in the first mask layer M1. An area of the first mask layer M1, which is exposed from the resist pattern PTP may be removed through an etching process ET1 to form the opening OP-M. The opening OP-M may correspond to an area in which the groove pattern GV is formed.

Figure 8F:
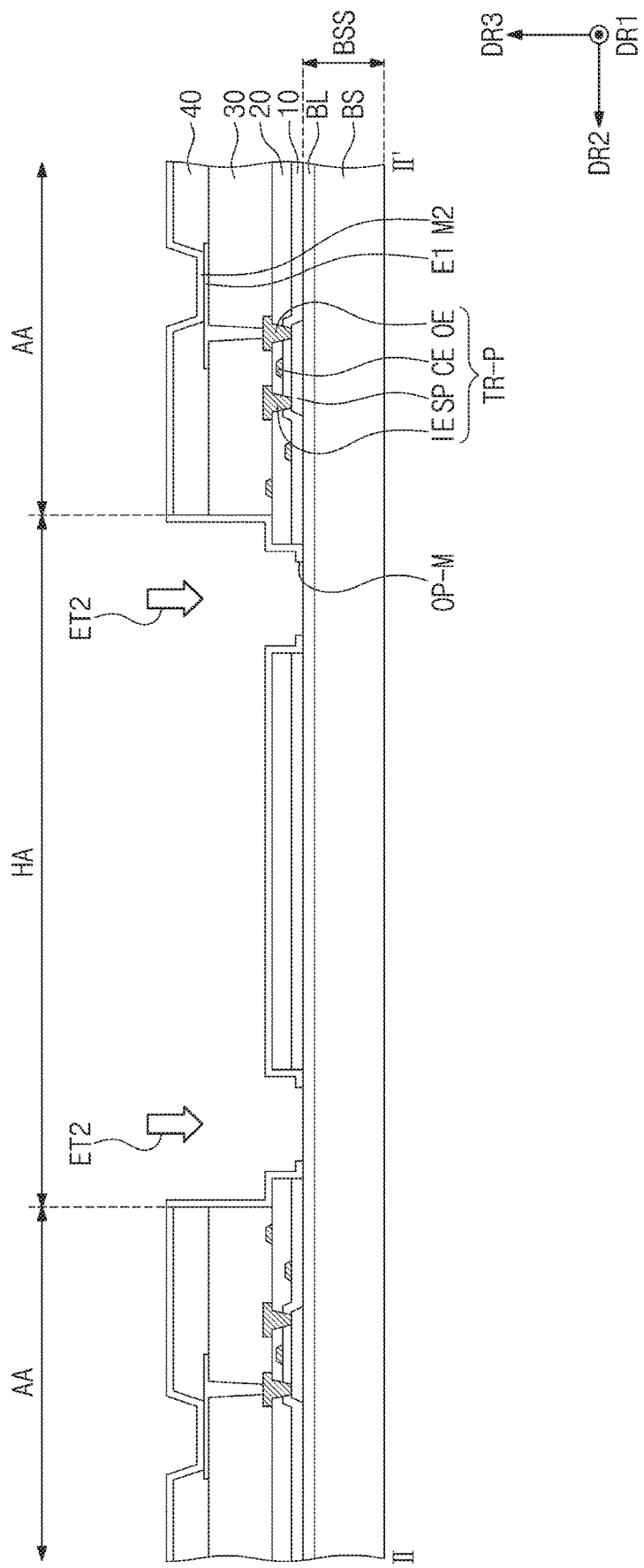
Figure 8G:
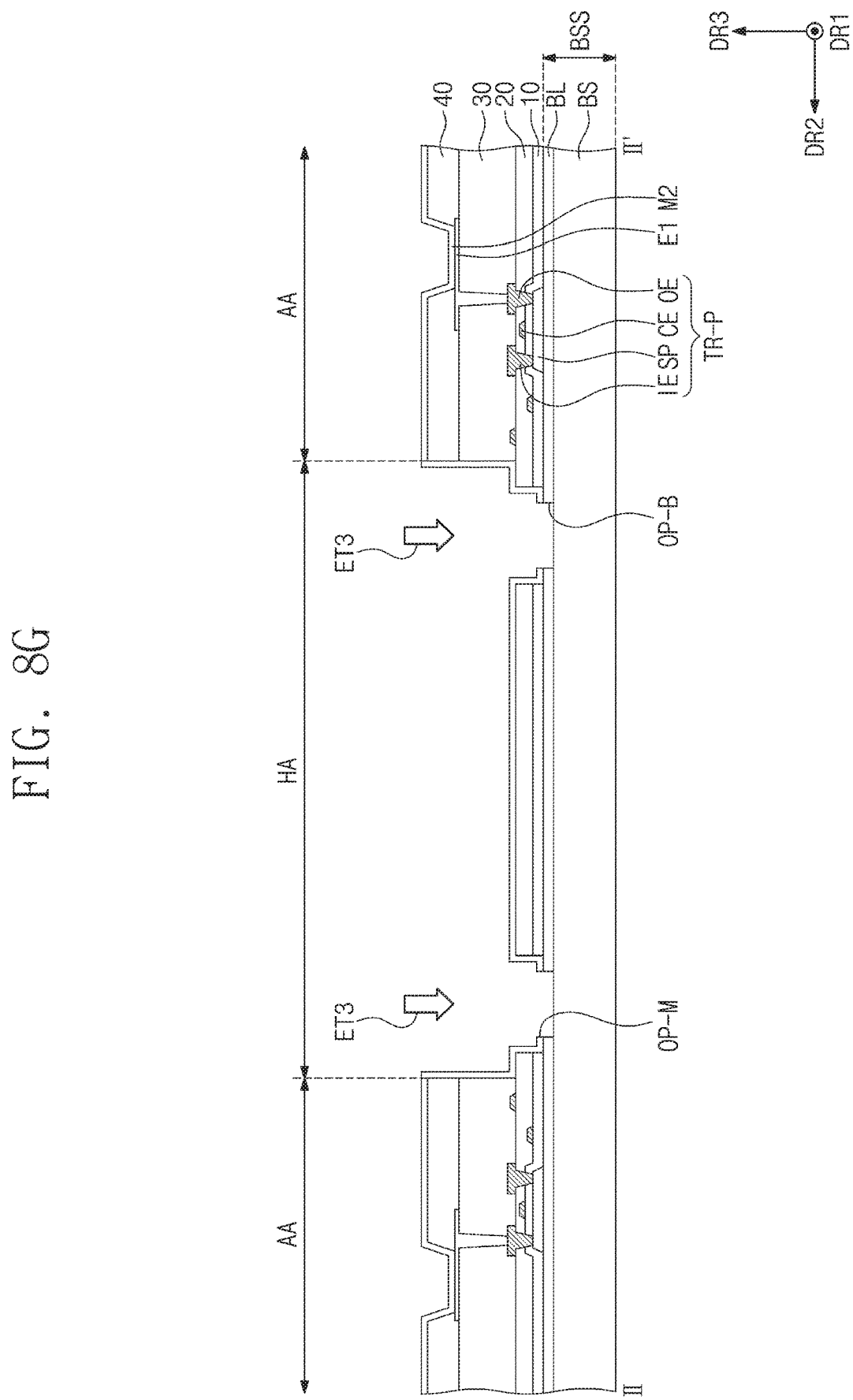

Thereafter, as illustrated in FIGS. 8F to 8H, a recess part HM is formed in the base substrate BSS. The recess part HM may be formed in the hole area HA. The recess part HM is formed in an area corresponding to the opening OP-M of the second mask M2.

Particularly, as illustrated in FIGS. 8F and 8G, after the resist pattern PRP is removed, an opening OP-B may be formed in an auxiliary layer BL by using the second mask layer M2 as a mask. An area of the auxiliary layer BL, which is exposed from the second mask layer M2, i.e., an area of the auxiliary layer BL, which is exposed by the opening OP-M of the second mask layer M2, may be removed through an etching process ET2 to form the opening OP-B.

Thereafter, as illustrated in FIGS. 8G and 8H, a portion of the base layer BS may be removed by using the second mask layer M2 as a mask to form the recess part HM. At least a portion of an area of the base layer BS, which is exposed for the auxiliary layer BL, i.e., at least a portion of an area of the auxiliary layer BL, which is exposed by the opening OP-B, may be removed through an etching process ET3. Here, an intensity and time of the etching process ET3 may be controlled to remove only a portion of the base layer having a thickness that is not enough to pass through the base layer BS. Thus, the recess part HM may pass through the auxiliary layer BL and then have a depth recessed from the base layer BS.

The recess part HM may have a side surface having a under-cut shape. A barrier layer BL may have an end that further protrudes than an inner surface of the base layer BS. This may be caused by a difference in etching rate between the base layer BL and the base layer BS. Thus, the recess part HM may include a predetermined tip part.

Figure 8I:
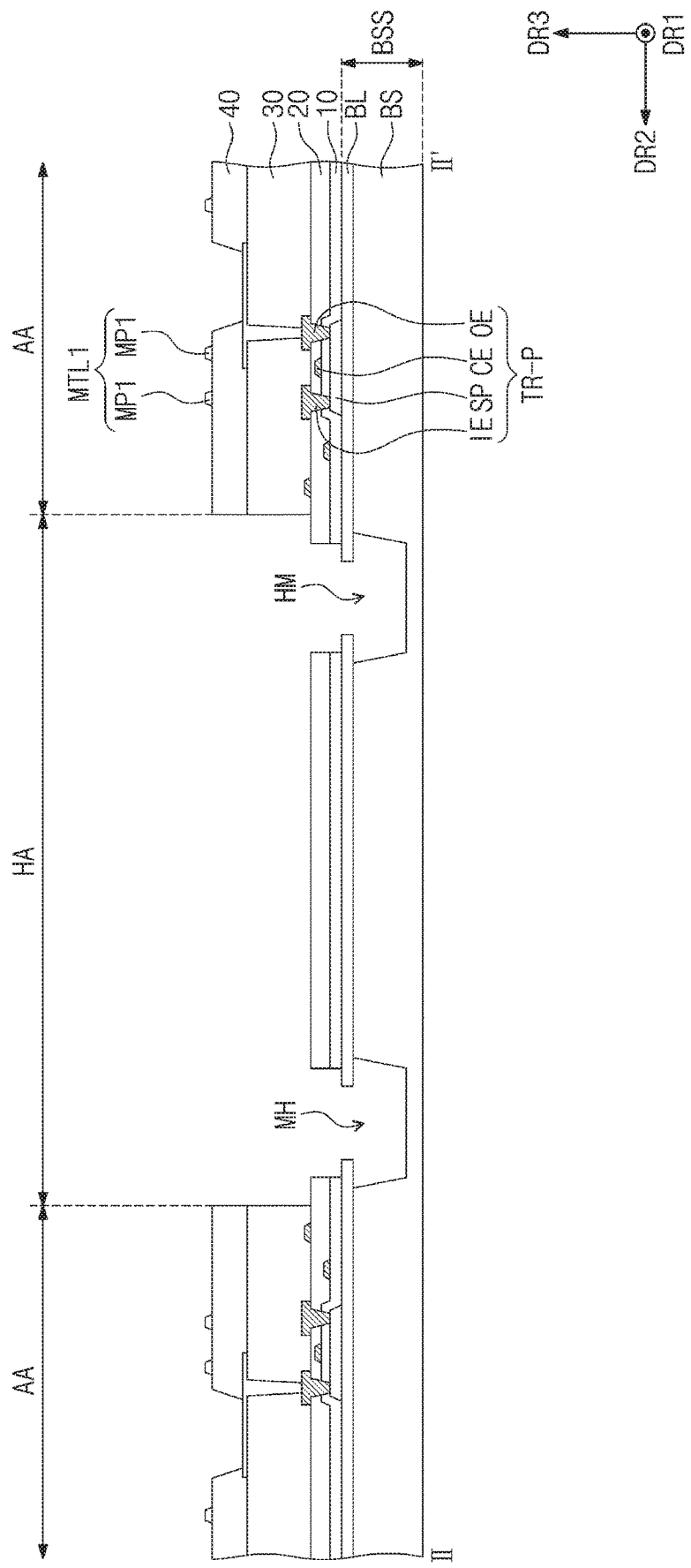

Thereafter, as illustrated in FIG. 8I, a first conductive layer MTL1 is formed on a fourth insulation layer 40. A first conductive layer MTL1 may be formed by patterning the second mask layer M2 to form a plurality of conductive patterns MP1. According to the inventive concept, the second mask layer M2 may not be removed but remain to serve as the first conductive layer MTL1. Thus, a process of removing the second mask M2 may be omitted, and a portion of the forming the input sensing unit may be performed during the process of forming the display unit.

Figure 8J:
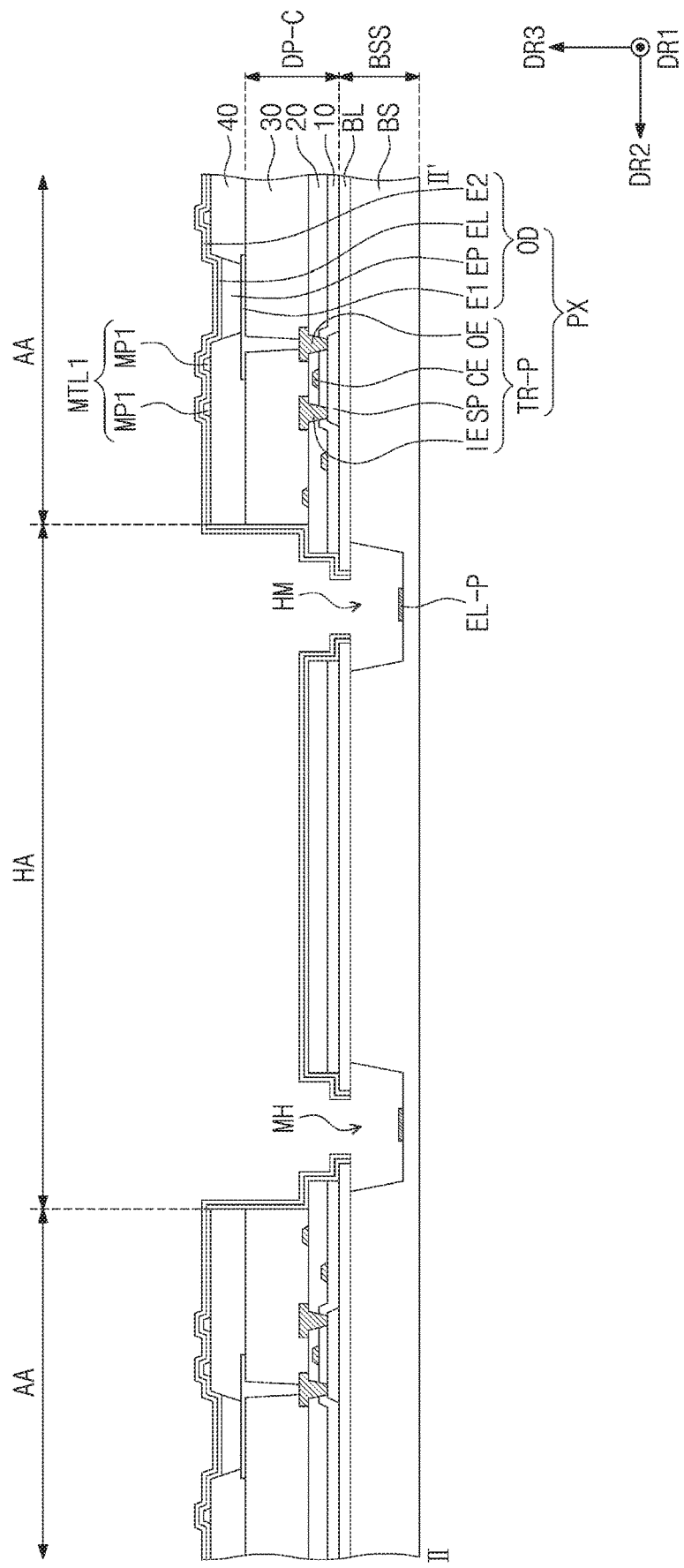

Thereafter, as illustrated in FIG. 8J, a light emitting device OD is formed. The light emitting device OD may be formed by sequentially forming a light emitting pattern EP, a control layer EL, and a second electrode E2 on the first electrode E1. The light emitting pattern EP may be formed by printing or injecting a luminescent material in the opening OP.

The control layer EL may be formed by depositing an organic material. The control layer EL may be formed by thermal deposition (i.e., evaporation). Here, a portion of the organic material may be deposited in the groove part HM to form an organic pattern EL-P. The second electrode E2 may be formed by depositing a conductive material. The deposition of the second electrode E2 may include a physical deposition process including thermal deposition and sputtering. Thus, although not shown, a portion of the conductive material may be formed in the groove part HM during the deposition process of the second electrode E2 to form a pattern.

Figure 8K:
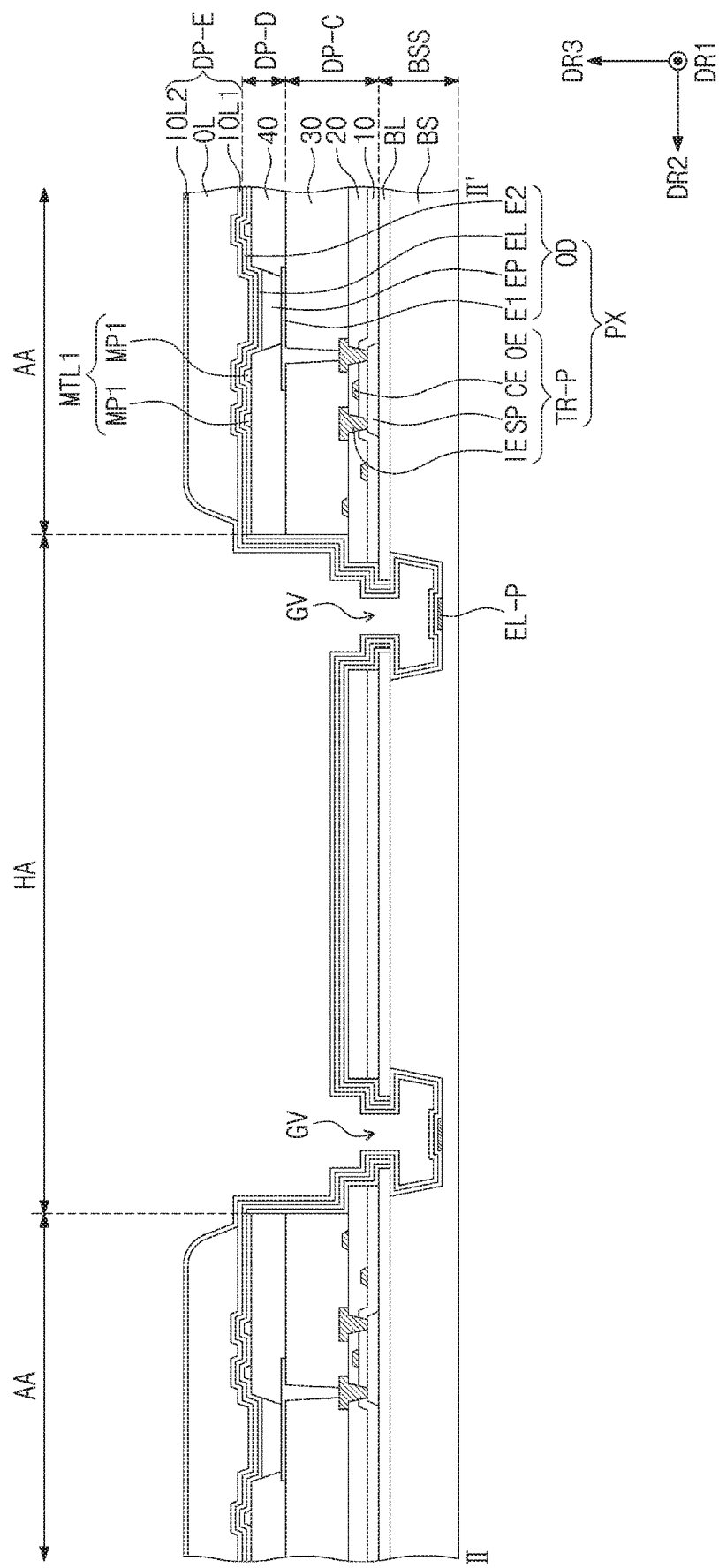
Figure 8L:
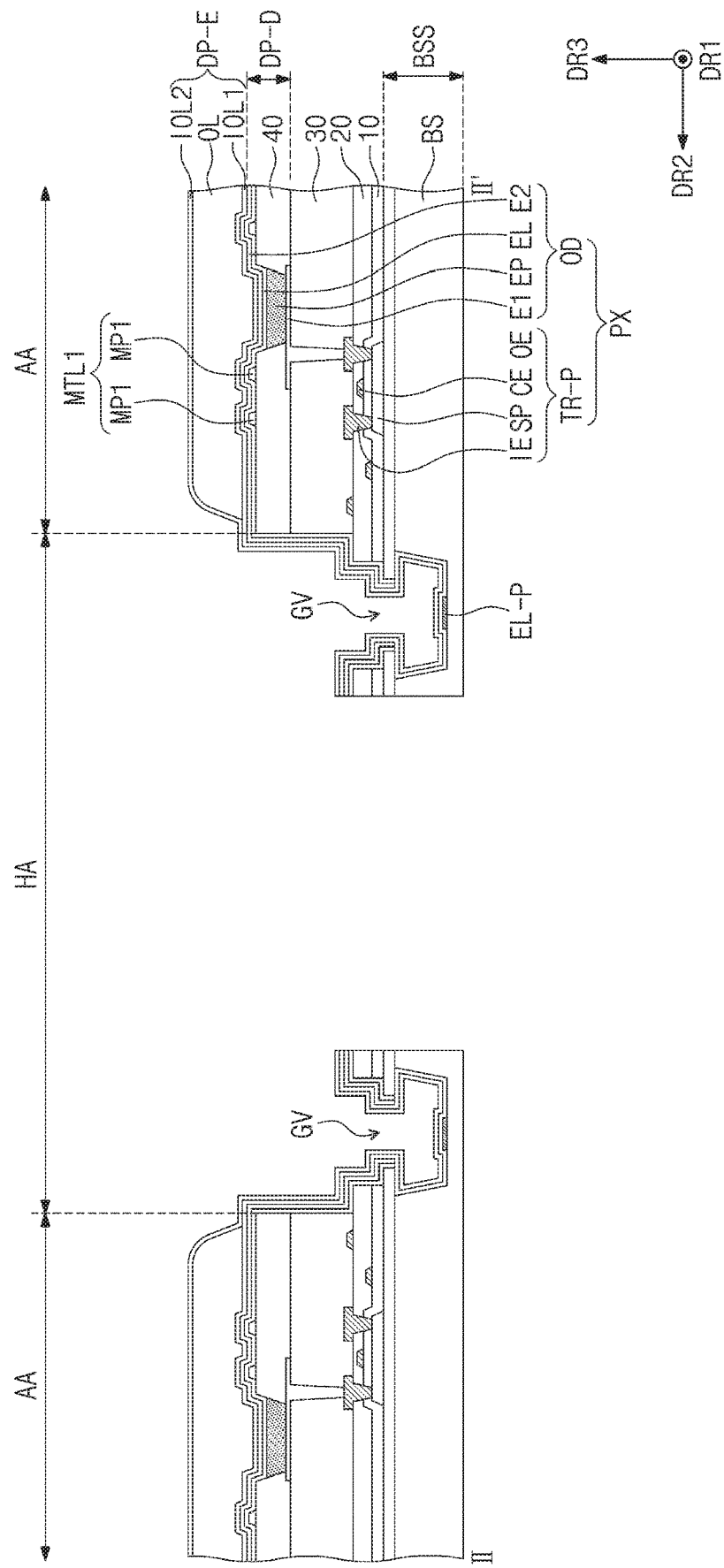

Thereafter, as illustrated in FIG. 8K, an encapsulation layer DP-E is formed on the display device layer DP-D. The encapsulation layer DP-E may be formed by sequentially laminating a first inorganic layer IOL1, an organic layer OL, and a second inorganic layer IOL2.

Particularly, the first inorganic layer IOL1 may be formed on the active area AA and the hole area HA. The first inorganic layer IOL1 may be formed by depositing an insulation material. For example, the first inorganic layer IOL1 may be formed by depositing an inorganic material or formed through chemical vapor deposition. Here, the first inorganic layer IOL1 may be formed along an inner surface of the groove part HM.

The organic layer OL may be formed by applying a liquid organic material to the first inorganic layer IOL1 through a solution process such as a screen printing process or an inkjet process. The liquid organic material covers a curved top surface of the first inorganic layer IOL1 to provide a flat surface. In this embodiment, although the organic layer OL is formed on the active area AA, the embodiment of the inventive concept is not limited thereto. For example, a portion of the organic layer OL may extend to fill a portion of the groove part HM according to an amount of applied or spread liquid organic material.

The second inorganic layer IOL2 may be formed by depositing an insulation material on the organic layer OL. For example, the second inorganic layer IOL2 may be formed by depositing an inorganic material or formed through chemical vapor deposition. The second inorganic layer IOL2 covers a top surface of the organic layer OL and a portion of the first inorganic layer IOL1, which is not covered by the organic layer OL. The second inorganic layer IOL2 may be formed to contact the first inorganic layer IOL1, and the organic layer OL may be sealed by the first inorganic layer IOL1 and the second inorganic layer IOL2. Here, the second inorganic layer IOL2 may be formed along an inner surface of the groove part HM, and thus, the groove pattern GV may be formed.

Thereafter, as illustrated in FIG. 8I, a module hole MH is formed in the hole area HA. The module hole MH may be formed to pass through the electronic panel PN. The base substrate BSS, the first insulation layer 10, the second insulation layer 20, the control layer EL, the second electrode E2, the first inorganic layer IOL1, and the second inorganic layer IOL2, which are disposed in the hole area HA, may be penetrated by laser or drilling.

Figure 8M:
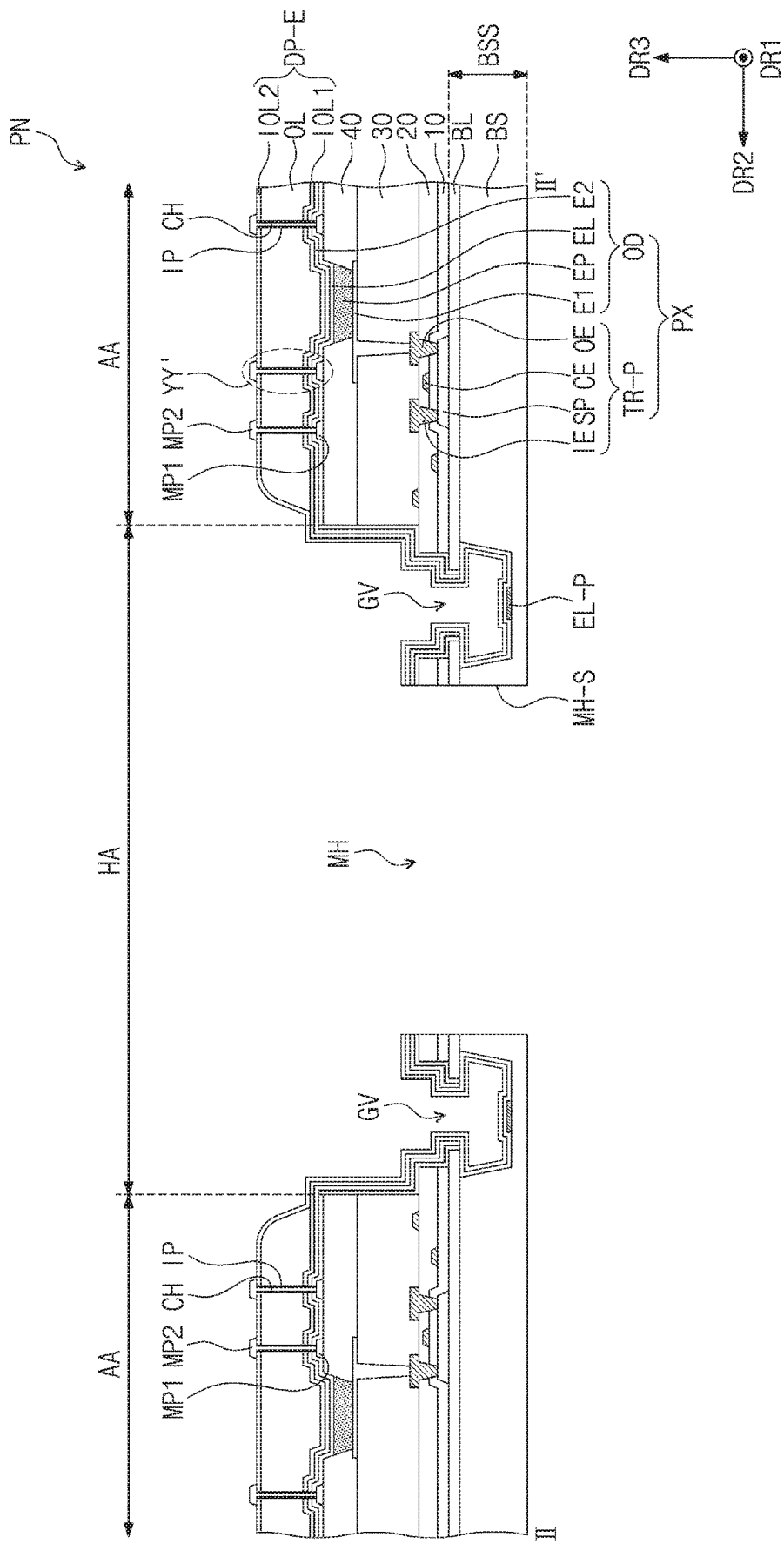

Thereafter, as illustrated in FIG. 8M, a plurality of second patterns MP2 may be formed on the encapsulation layer DP-E to form the input sensing unit. This will be described with reference to FIGS. 9A to 9E.

Figure 9A:
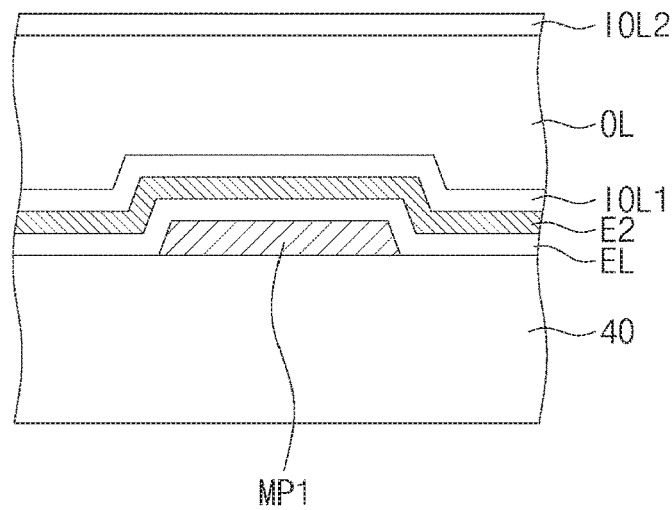
FIGS. 9A, 9B, 9C, 9D, and 9E are cross-sectional views illustrating a process of manufacturing an electronic panel according to an embodiment of the inventive concept.

As illustrated in FIG. 9A, a first conductive pattern MP1 is formed on the fourth insulation layer 40, and the control layer EL, the second electrode E2, the first inorganic layer IOL1, the organic layer OL, and the second inorganic layer IOL2 are sequentially laminated on the first conductive pattern MP1. FIG. 9A may correspond to the process of FIG. 8I.

Figure 9B:
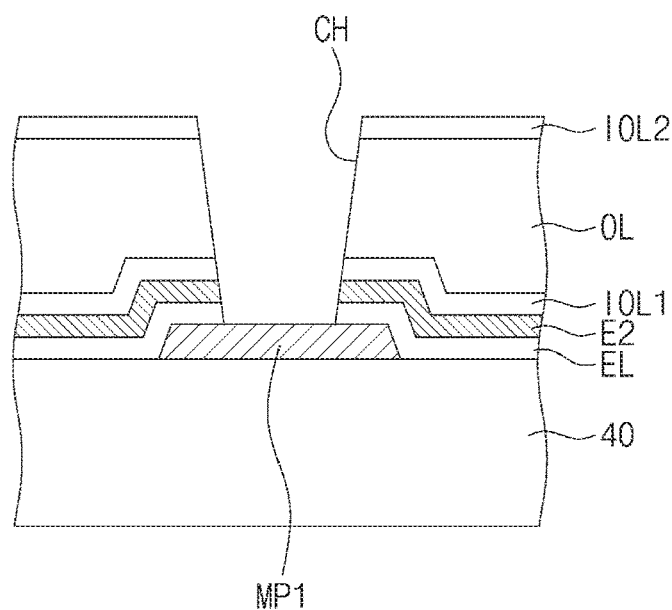

Thereafter, as illustrated in FIG. 9B, a contact hole CH exposing the first conductive pattern MP1 is formed. The contact hole CH may be formed by removing portions of the control layer EL, the second electrode E2, the first inorganic layer IOL1, the organic layer OL, and the second inorganic layer IOL2 through a predetermined etching process. The etching process for forming the contact hole CH may be performed as a single process or a plurality of processes. The etching process may be performed under different environments for each of the control layer EL, the second electrode E2, the first inorganic layer IOL1, the organic layer OL, and the second inorganic layer IOL2, but is not limited to a specific embodiment.

Figure 9C:
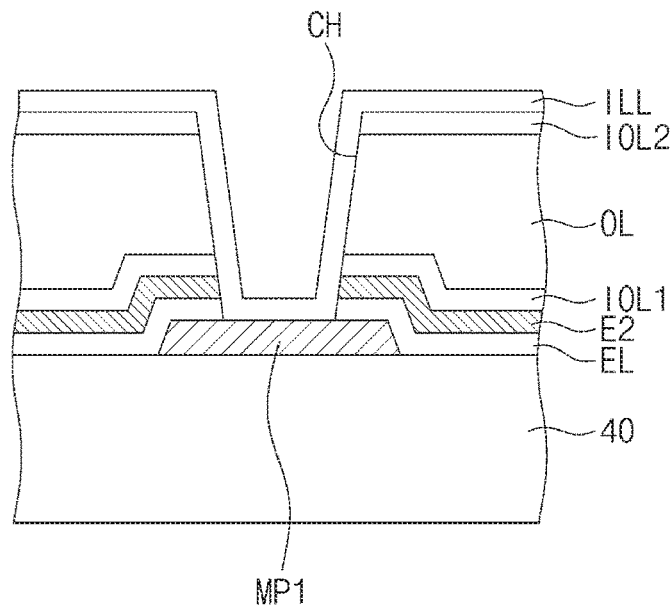

Thereafter, as illustrated in FIG. 9C, an insulation layer ILL is formed. The insulation layer ILL may be formed by depositing or applying an insulation material. Here, the insulation layer ILL may cover a top surface of the second inorganic layer IOL2, an inner surface of the contact hole CH, and a portion of the first conductive pattern MP1, which is exposed by the contact hole CH.

Figure 9D:
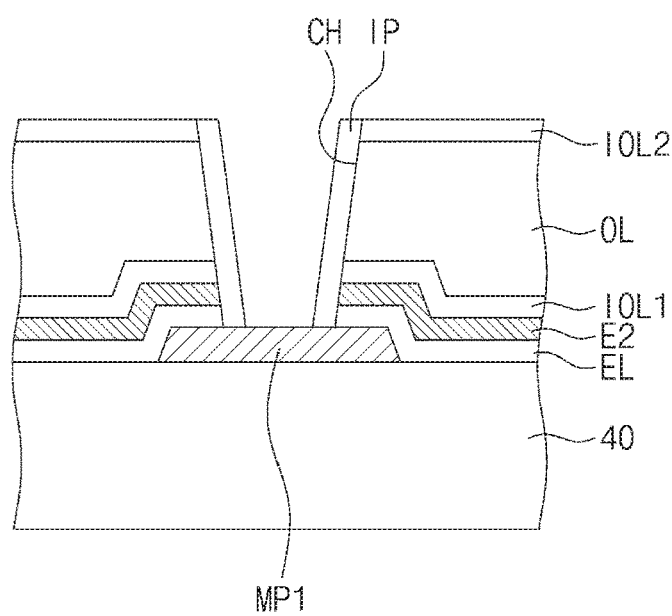

Thereafter, as illustrated in FIG. 9D, the insulation layer ILL may be patterned to form an inner insulation layer IP. The inner insulation layer IP may be formed by leaving only the portion of the insulation layer IL, which covers the inner surface of the contact hole CH, and removing the remaining portions. Particularly, the inner insulation layer IP may be formed by removing the portion of the insulation layer ILL, which covers the top surface of the second inorganic layer IOL2, and the portion of the insulation layer ILL, which covers the top surface of the first conductive pattern MP1. Thus, a portion of the first conductive pattern MP1 may be exposed from the inner insulation layer IP, and the second electrode E2 may be covered by the inner insulation layer IP. Although not shown, the portion of the insulation layer ILL, which covers the top surface of the second inorganic layer IOL2, may not be removed to remain on the second inorganic layer IOL2, but the inventive concept is not limited to a specific embodiment.

Figure 9E:
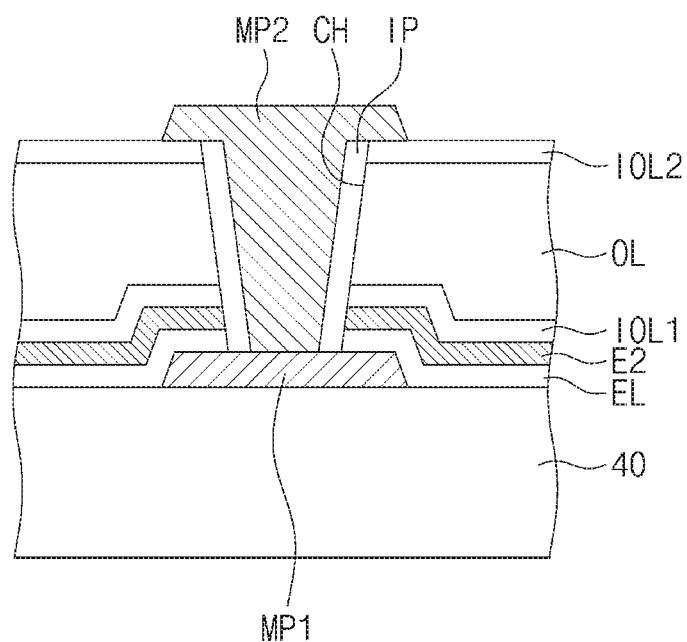

Thereafter, as illustrated in FIG. 9E, a second conductive pattern MP2 is formed. The second conductive pattern MP2 may be formed by depositing or applying a conductive material on the second inorganic layer 10L2 and then patterning the deposited or applied conductive material. The second conductive pattern MP2 may contact the top surface MP1, which is exposed from the inner insulation layer IP.

Thus, even though the first conductive pattern MP1 and the second conductive pattern MP2 are spaced apart from each other with the encapsulation layer DP-E therebetween, the first conductive pattern MP1 and the second conductive pattern MP2 may be easily connected to each other. Also, even though the second electrode E2 is disposed between the first conductive pattern MP1 and the second conductive pattern MP2, since the second electrode E2 is covered by the inner insulation layer IP, the electrical connection between the second electrode E2 and the second conductive pattern MP2 may be stably interrupted.

According to the inventive concept, a portion of the constituents of the input sensing unit may be disposed between the constituents of the display unit, and the electrical interference between the constituents may be prevented. Thus, the electronic apparatus may be reduced in thickness, and the integration of the plurality of units on the cross-section may be improved.

Also, according to the inventive concept, a portion of the constituents of the input sensing unit may be formed in the process of manufacturing the display unit. Thus, the number of processes may be reduced to reduce manufacturing cost.

It will be apparent to those skilled in the art that various modifications and variations can be made in the inventive concept. Thus, it is intended that the present disclosure covers the modifications and variations of this invention provided they come within the scope of the appended claims and their equivalents.

Hence, the real protective scope of the inventive concept shall be determined by the technical scope of the accompanying claims.

What is claimed is:

1. An electronic apparatus comprising:
 a base substrate which comprises a front surface and a rear surface facing each other, and in which a module hole passing through the front and rear surfaces is defined;
 a thin film transistor disposed on the base substrate;
 a light emitting device comprising a first electrode connected to the thin film transistor, a second electrode disposed on the first electrode, and a light emitting pattern disposed between the first electrode and the second electrode;
 an encapsulation layer comprising a first organic layer and covering the light emitting device;
 an input sensing unit disposed on the base substrate and comprising a plurality of first conductive patterns and a plurality of second conductive patterns that is disposed on the plurality of first conductive patterns; and
 an insulation layer disposed between the plurality of first conductive patterns and the plurality of second conductive patterns,
 wherein the plurality of first conductive patterns of the input sensing unit is disposed below the first organic layer of the encapsulation layer and the plurality of second conductive patterns of the input sensing unit is disposed above the first organic layer of the encapsulation layer in a thickness direction of the electronic apparatus.

2. The electronic apparatus of claim 1, wherein the plurality of second conductive patterns comprises:
 a first sensing electrode extending in a first direction; and
 a second sensing electrode extending in a second direction crossing the first direction to generate capacitance together with the first sensing electrode.

3. The electronic apparatus of claim 2, wherein at least a portion of the first plurality of conductive patterns is connected to at least a portion of the plurality of second conductive patterns through a contact hole passing through the encapsulation layer.

4. The electronic apparatus of claim 3, wherein the plurality of first conductive patterns overlap the second electrode on a plane, and
 the contact hole passes through the second electrode.

5. The electronic apparatus of claim 3, further comprising an inner insulation layer that covers a side surface of the contact hole,
 wherein the second electrode and the second plurality of conductive patterns are electrically connected to each other by the inner insulation layer.

6. The electronic apparatus of claim 1, wherein each of the first electrode, the light emitting pattern, and the second electrode is provided in plurality, and
 the second electrodes are disposed to overlap the light emitting patterns, respectively.

7. The electronic apparatus of claim 6, wherein the plurality of first conductive patterns are spaced apart from the second electrodes on the plane.

8. The electronic apparatus of claim 6, further comprising an auxiliary electrode adjacent to the first electrodes,
 wherein the second electrodes are connected to the auxiliary electrode.

9. The electronic apparatus of claim 6, wherein the plurality of first conductive patterns and the plurality of second conductive patterns are spaced apart from each other on the plane.

10. The electronic apparatus of claim 1, wherein the insulation layer comprises a second organic layer disposed between the first electrode and the second electrode, and
the second organic layer entirely covers the plurality of first conductive patterns.

11. The electronic apparatus of claim 10, wherein the insulation layer further comprises a plurality of insulation patterns that respectively cover the plurality of first conductive patterns, and
the second organic layer covers the plurality of insulation patterns.

12. The electronic apparatus of claim 11, wherein the plurality of insulation patterns covers top and side surfaces of each of the plurality of first conductive patterns, respectively.

13. The electronic apparatus of claim 1, wherein the encapsulation layer further comprises a first inorganic layer and a second inorganic layer disposed on the first inorganic layer, the first organic layer being disposed between the first inorganic layer and the second inorganic layer, and
the module hole passes through the first inorganic layer, the first organic layer, and the second inorganic layer.

14. The electronic apparatus of claim 13, further comprising a groove part defined along an edge of the module hole and recessed from the front surface of the base substrate,
wherein the first inorganic layer and the second inorganic layer cover a side surface of the groove part.

15. The electronic apparatus of claim 14, further comprising an organic pattern disposed in the groove part,
wherein the organic pattern is covered by the first inorganic layer and the second inorganic layer.

16. The electronic apparatus of claim 15, wherein the organic pattern comprises a same material as at least one of the insulation layer and the second electrode.

17. A method for manufacturing an electronic apparatus, the method comprising:
forming a thin film transistor on a base substrate comprising a hole area and an active area adjacent to the hole area;
forming a first electrode connected to the thin film transistor on the active area;
forming an insulation layer in which an opening exposing at least a portion of the first electrode is defined;
forming a first mask layer comprising an opening exposing at least a portion of the hole area of the base substrate;
forming a recess part in the base substrate through the opening of the first mask layer;
patterning the first mask layer to form a plurality of first conductive patterns, which are spaced apart from the opening;
forming a light emitting pattern in the opening;
forming an organic layer overlapping the light emitting pattern and the first conductive pattern on a plane;
forming a second electrode on the organic layer;
forming an encapsulation layer on the second electrode; and
forming a plurality of second conductive patterns on the encapsulation layer.

18. The method of claim 17, further comprising:
forming a plurality of contact holes passing through the encapsulation layer and the second electrode; and
forming an inner insulation layer covering inner surfaces of the contact holes and exposing top surfaces of at least a portion of the first conductive patterns,
wherein at least a portion of the second conductive patterns contacts top surfaces of the first conductive patterns exposed through the contact holes.

19. The method of claim 17, wherein the light emitting pattern is provided in plurality, and
the forming of the second electrode further comprises forming a plurality of patterns respectively overlapping the light emitting patterns.

20. The method of claim 17, wherein the base substrate comprises a base layer and an auxiliary layer covering a front surface of the base layer, and
the recess part passes through the auxiliary layer and is recessed from the front surface of the base layer.

* * * * *